(12) United States Patent
Wohlmuth

(10) Patent No.: US 7,952,150 B1
(45) Date of Patent: May 31, 2011

(54) ENHANCEMENT MODE MOSFET AND DEPLETION MODE FET ON A COMMON GROUP III-V SUBSTRATE

(75) Inventor: Walter A. Wohlmuth, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/479,290

(22) Filed: Jun. 5, 2009

Related U.S. Application Data

(60) Provisional application No. 61/059,116, filed on Jun. 5, 2008.

(51) Int. Cl.
*H01L 27/88* (2006.01)

(52) U.S. Cl. ........................ 257/392; 257/192

(58) Field of Classification Search ............ 257/392
See application file for complete search history.

(56) References Cited

U.S. PATENT DOCUMENTS

| | | | |
|---|---|---|---|
| 5,060,031 A * | 10/1991 | Abrokwah et al. | ........... 257/274 |
| 5,610,410 A | 3/1997 | Imanishi | |
| 5,912,480 A | 6/1999 | Zhu et al. | |
| 7,119,381 B2 | 10/2006 | Passlack | |

OTHER PUBLICATIONS

Cao, Y. et al., "Microwave Performance of GaAs MOSFET With Wet Thermally Oxidized InAlP Gate Dielectric," IEEE Electron Device Letters, May 2006, pp. 317-319, vol. 27, No. 5, IEEE.
Chough, K. B. et al., "Al[0.25]In[0.75]P/Al[0.48]IN[0.52]As/Ga[0.35]In[0.65]As Graded Channel Pseudomorphic HEMT's with High Channel-Breakdown Voltage," IEEE Electron Device Letters, Jan. 1994, pp. 33-35, vol. 15, No. 1, IEEE.
Kim, Hyoung-Sub et al., "Depletion-mode GaAs Metal-Oxide-Semiconductor Field-Effect Transistor With HfO2 Dielectric and Germanium Interfacial Passivation Layer," Applied Physics Letters, 2006, vol. 89, No. 222904, American Institute of Physics.
Lee, Kuan-Wei et al., "InGaP/InGaAs/GaAs Metal-oxide-Semiconductor Pseudomorphic High Electron Mobility Transistor with a Liquid Phase Oxidized InGaP Gate," Proceedings of the 7th International Conference on Solid-State and Integrated Circuits Technology, 2004, pp. 2301-2304, IEEE.
Li, X. et al., "GaAs MOSFET Using InAlP Native Oxide as Gate Dielectric," IEEE Electron Device Letters, Dec. 2004, pp. 772-774, vol. 25, No. 12, IEEE.
Matsuzaki, Hideaki et al, "Suppression of Short-Channel Effect in Pseudomorphic In[0.25]A[0.75]P/In[0.75]Ga [0.25]As High Electron Mobility Transistors," IEICE Electronics Express, 2004, pp. 292-297, vol. 1, No. 11, IEICE.

(Continued)

*Primary Examiner* — Kimberly D Nguyen
*Assistant Examiner* — Tony Tran
(74) *Attorney, Agent, or Firm* — Withrow & Terranova, P.L.L.C.

(57) ABSTRACT

The present invention relates to providing an enhancement-mode (e-mode) Metal-Oxide-Semiconductor Field Effect Transistor (MOSFET) with a complementary depletion-mode (d-mode) FET on a common group III-V substrate. The depletion mode FET may be another MOSFET, a MEtal-Semiconductor FET (MESFET), a High Electron Mobility Transistor (HEMT), or like FET structure. In particular, the e-mode MOSFET includes a gate structure that resides between source and drain structures on a transistor body. The gate structure includes a gate contact that is separated from the transistor body by a gate oxide. The gate oxide is an oxidized material that includes Indium and Phosphorus. The gate oxide is formed beneath the gate contact.

35 Claims, 18 Drawing Sheets

OTHER PUBLICATIONS

Passlack, Matthias et al., "Electrical Properties of Ga[2]O[3]/GaAs Interfaces and GdGaO Dielectrics in GaAs-Based MOSFETs," IEEE Electron Device Letters, Jan. 2009, pp. 2-4, vol. 30, No. 1, IEEE.

Sun, Yanning et al, "High-Performance In[0.7]Ga[0.3]As-Channel MOSFETs With High-Kaph Gate Dielectrics and Alpha-Si Passivation," IEEE Electron Device Letters, Jan. 2009, pp. 5-7, vol. 30, No. 1, IEEE.

Xuan, Y. et al., "Substrate Engineering for High-Performance Surface-Channel III-V Metal-Oxide-Semiconductor Field-Effect Transistors," Applied Physics Letters, 2007, vol. 91, No. 232107, American Institute of Physics.

Yamane, Yasuro et al., "0.1-micrometer InAlP/InAIAs/InGaAs/InP HEMTs With Improved Breakdown Voltages," Proceedings of the 11th International Conference on Indium Phosphide and Related Materials, May 16-20, 1999, pp. 311-314, IEEE.

Ye, P.D. et al., "GaAs MOSFET With Oxide Gate Dielectric Grown by Atomic Layer Deposition," IEEE Electron Device Letters, Apr. 2003, pp. 209-211, vol. 24, No. 4, IEEE.

Zhang, Jing et al., "Fabrication and Performance of 0.25-micrometer Gate Length Depletion-Mode GaAs-Channel MOSFETs With Self-Aligned InAlP Native Oxide Dielectric," IEEE Electron Device Letters, Feb. 2008, pp. 143-145, vol. 29, No. 2, IEEE.

* cited by examiner

ENHANCEMENT MODE MOSFET AND DEPLETION MODE FET ON A COMMON GROUP III-V SUBSTRATE

This application claims the benefit of U.S. provisional application Ser. No. 61/059,116 filed Jun. 5, 2008, the disclosure of which is incorporated herein by reference in its entirety.

FIELD OF THE INVENTION

The present invention relates to field effect transistors, and in particular to providing an enhancement mode MOSFET and depletion mode FET on a common group III-V substrate.

BACKGROUND OF THE INVENTION

Field effect transistors (FETs) have become ubiquitous in modern electronics and are used in switching, amplifying, logic, and memory applications.

In general, a FET has four terminals, which include a source, a gate, a drain, and a body. In many FETs, the body is connected to the source inside the device package. Current flows from the drain to the source in a FET and the amount of current flow is controlled by the voltage applied between the gate and the source. The current flows in a conduction channel, which is generally referred to simply as a channel, and extends between the drain and source of the FET. The amount of current that flows from the drain to the source is proportional to the size of the channel, and the channel size is controlled by the strength of an electric field that is produced when a voltage is applied between the gate and source.

FETs generally have one of two gate structures. The first gate structure provides a gate dielectric to insulate the gate contact from the channel that resides below the gate structure. The gate dielectric is generally an oxide. FETs having this insulated gate structure are generally referred to as a Metal-Oxide-Semiconductor FET (MOSFET). The second gate structure does not incorporate a gate dielectric and places the gate contact substantially directly on the underlying semiconductor. FETs with the second gate structure are referred to as Schottky-gate devices, which include Metal Semiconductor FETS (MESFETs) and High Electronic Mobility Transistors (HEMTs).

FETS may be divided into depletion-mode (d-mode) and enhancement-mode (e-mode) types, depending on whether the FET is normally on or off when no voltage is applied between the gate and source. E-mode FETS are normally off when the gate-to-source voltage is zero. Application of the proper gate-to-source voltage creates a channel between the drain and source and allows current to flow therebetween. As the gate-to-source voltage increases, the channel size increases, and the resultant drain-to-source current increases. In contrast, d-mode FETS are normally on when the gate-to-source voltage is zero. As such, a channel is normally available and current flows between the drain and source when the gate-to-source voltage is zero. Application of the proper gate-to-source voltage reduces the size of the normally available channel between the drain and source and restricts current flow therebetween. As the gate-to-source voltage increases, the channel decreases, and the resultant drain-to-source current decreases.

In many applications, it is beneficial to incorporate both e-mode and d-mode FETs in a circuit design. Given the constant demand for further integration and reduced component sizes, there is a further need to build e-mode and d-mode FETs on a single wafer. Although building these complementary FETS in silicon-based material systems has proven to be relatively easy, the transition to other material subsystems has proven to be more difficult. In particular, little success has been garnered in building complementary FETs in group III-V based material subsystems, and in particular Gallium Arsenide (GaAs) and Indium Phosphide (InP) based material subsystems.

In Silicon-based material subsystems, a pair of complementary MOSFETs may include an N-channel MOSFET, which uses electrons for current conduction, and a P-channel MOSFET, which uses holes for current conduction. The mobility of electrons and holes in Silicon is closely matched. For instance, the low-field mobility of electrons is only two or three times that of the holes. As such, a pair of complementary N- and P-channel MOSFETs can be roughly the same size and have a similar structure while providing complementary operational traits. Unfortunately, there is large difference in electron and hole mobility in group III-V material systems. For instance, the low-field mobility of electrons in GaAs is about 20 times that of the holes. This difference in electron and hole mobility requires the effective gate length of a P-channel device to be sized much smaller than the gate length of an N-channel device to achieve similar performance. As such, the size and structure of the respective complementary devices that provide similar performance are quite different. When used in a complementary fashion, the geometry of the gate structure for the P-channel device is significantly different than that of the N-channel device. These differences present difficulties in layout and manufacturing as well as impact overall performance of these devices when they are connected in a complementary fashion.

Another issue with group III-V material systems has been forming an acceptable gate dielectric for MOSFETs. Although forming an oxide for a gate dielectric in Silicon has always been relatively easy; forming effective oxides in group III-V material systems has proven to be difficult. When an oxide for the gate dielectric is created for group III-V material systems, the interface properties between the oxide and the underlying semiconductor material tends to perform poorly. In particular, the interface traps and interface defects tend to be high, and the interface tends to absorb impurities at an excessive rate.

Accordingly, there is a need for an efficient and effective technique to form complementary FETs in a group III-V material system that does not require the complementary devices to be disparately sized. There is a further need for an effective oxide to use as a gate dielectric when providing complementary FETs in a group III-V material subsystem.

SUMMARY OF THE INVENTION

The present invention relates to providing an enhancement-mode (e-mode) Metal-Oxide-Semiconductor Field Effect Transistor (MOSFET) with a complementary depletion-mode (d-mode) FET on a common group III-V substrate. The depletion mode FET may be another MOSFET, a MEtal-Semiconductor FET (MESFET), a High Electron Mobility Transistor (HEMT), or like FET structure. In particular, the e-mode MOSFET includes a gate structure that resides between source and drain structures on a transistor body. The gate structure includes a gate contact that is separated from the transistor body by a gate oxide. The gate oxide is preferably formed by oxidizing at least a portion of an oxidizable material layer that includes both Aluminum and Phosphorus. For example, the oxidizable material layer may be formed of Aluminum Phosphide (AlP), Indium Aluminum Phosphide (InAlP), and Indium Aluminum Gallium Phosphide (InAl- GaP). In certain embodiments, the gate oxide will include Aluminum and Phosphorus, but will include essentially no Arsenic (As). The gate oxide resides beneath the gate contact.

In one embodiment, the e-mode MOSFET is formed on the same substrate as a d-mode MOSFET. The d-mode MOSFET also includes a gate structure that includes a gate contact that is separated from the d-mode MOSFET's body by a gate oxide. The gate oxide for the d-mode MOSFET includes both Aluminum and Phosphorus and is preferably formed by oxidizing another portion of the same oxidizable material layer that was used to form the gate oxide of the e-mode MOSFET. Unoxidized portions of the oxidizable material layer may remain over or be etched away from the e-mode and d-mode MOSFET bodies.

In another embodiment, the e-mode MOSFET is formed on the same substrate as a d-mode HEMT. The body of the d-mode HEMT includes a plurality of epitaxial layers that provide at least a buffer layer and a channel layer of the buffer layer. A Schottky layer is provided over the channel layer and is formed from an unoxidized portion of the oxidizable material layer. The gate structure for the d-mode HEMT includes a gate contact, which is formed on or in the Schottky layer. No gate oxide is employed for the HEMT. Preferably, the Schottky layer is formed from the same oxidizable material layer that was used to form the gate oxide of the e-mode MOSFET; however, the Schottky layer is from an unoxidized portion of layer while the gate oxide is formed from an oxidized portion of the oxidizable material layer.

In yet another embodiment, the e-mode MOSFET is formed on the same substrate as a d-mode MESFET. The gate structure for the d-mode HEMT includes a gate contact, which is formed on the body of the MESFET. The body of the MESFET may include one or more unoxidized portions of the oxidizable material layer, and the gate contact may reside on an unoxidized portion of the oxidizable material layer. Alternatively, the oxidizable material layer may be removed from the body, such that the gate contact does not reside on or over any oxidized or unoxidized portions of the oxidizable material layer.

In any of the above embodiments, a sub-gate area resides in the FET body and beneath the gate structure of the MOSFET, HEMT, MESFET, or other FET structure. The sub-gate areas for e-mode MOSFET and the complementary d-mode FET may be doped with an N-type material. Preferably, the sub-gate area for the d-mode FET is doped at a higher concentration than the sub-gate area for the complementary e-mode MOSFET. The amount of doping in each sub-gate area will vary depending on the desired characteristics of the respective devices. However, the sub-gate area for the e-mode MOSFET remains doped at a level sufficient to ensure it operates as an e-mode device while the sub-gate area for the d-mode FET remains doped at a level sufficient to ensure it operates as a d-mode device.

For e-mode or d-mode MOSFETs, the oxidizable material layer may be selectively oxidized in only those portions where an oxide is desired. For example, those portions of the oxidizable material layer beneath the source and drain structures are not oxidized, while the portions of the oxidizable material layer that form the gate oxides beneath the gate contacts are oxidized. Alternatively, all or most of the oxidizable material layer may be oxidized in blanket fashion, wherein unwanted portions of the oxidized oxidizable material layer are etched away after being oxidized. Desired portions, such as the gate oxides, are maintained. As another alternative, the oxidizable material layer may be selectively etched prior to being oxidized. Preferably, no oxidized portions of the oxidizable material layer will reside beneath the source and drain structures of any FET or the gate contacts of HEMT or MESFET structures.

In preferred embodiments, the oxidizable material layer will not include Arsenic and will be used in a GaAs-based material system. Implanted regions for source and drain implants or a gate implant are formed by selectively implanting N- or P-type dopants in FET bodies before or after at least certain portions of the oxidizable material layer are oxidized. Further, it is preferable to form the FET bodies, including the body epitaxial structure for a HEMT, up to and including the oxidizable material layer during a single growth sequence. A single growth sequence is one in which the body and the oxidizable material layer are consecutively formed in a growth chamber without being removed from the growth chamber.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 10A:
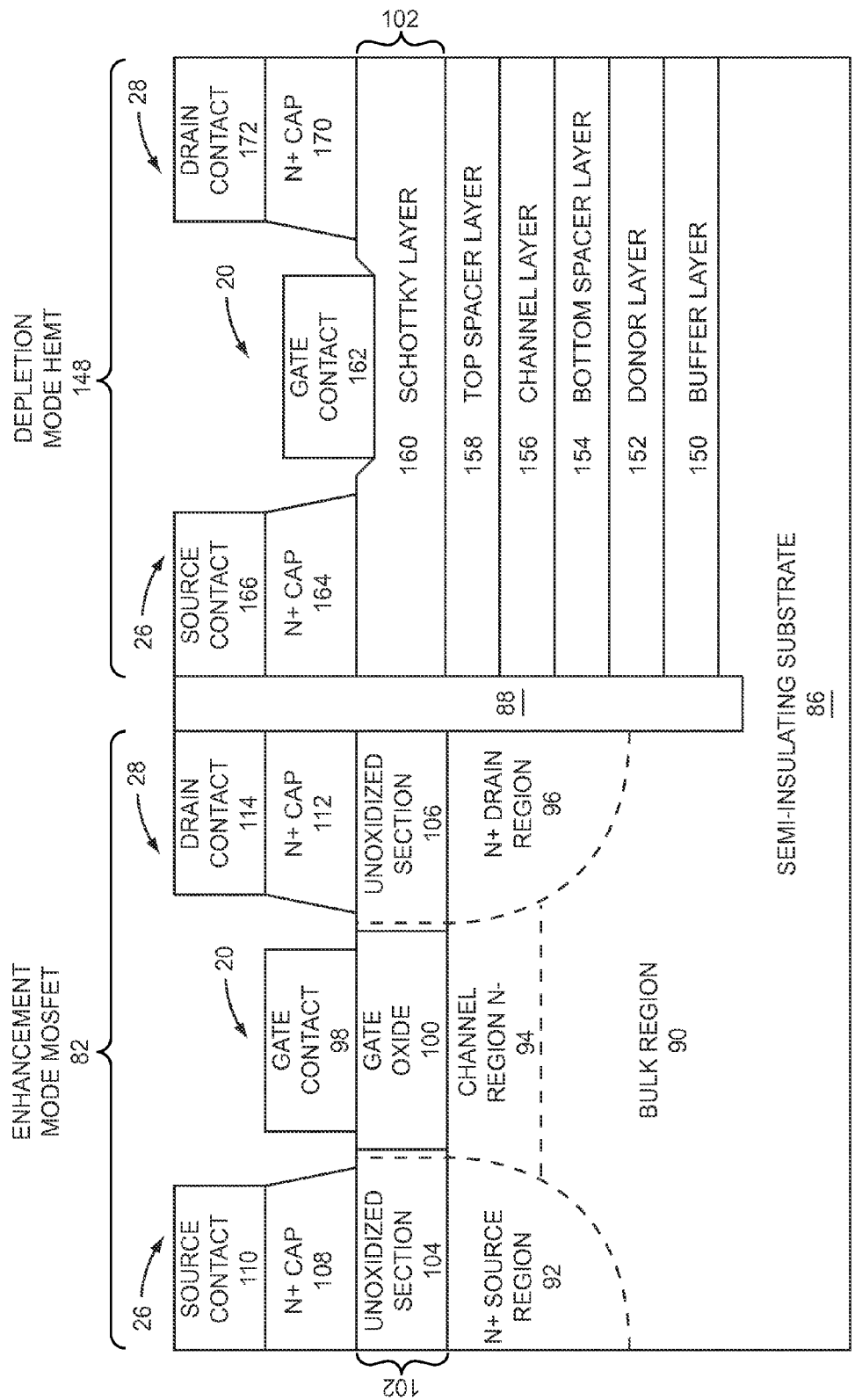
FIG. 10A is a first embodiment of an e-mode MOSFET and a d-mode HEMT provided on a common substrate according to the present invention.
Figure 10B:
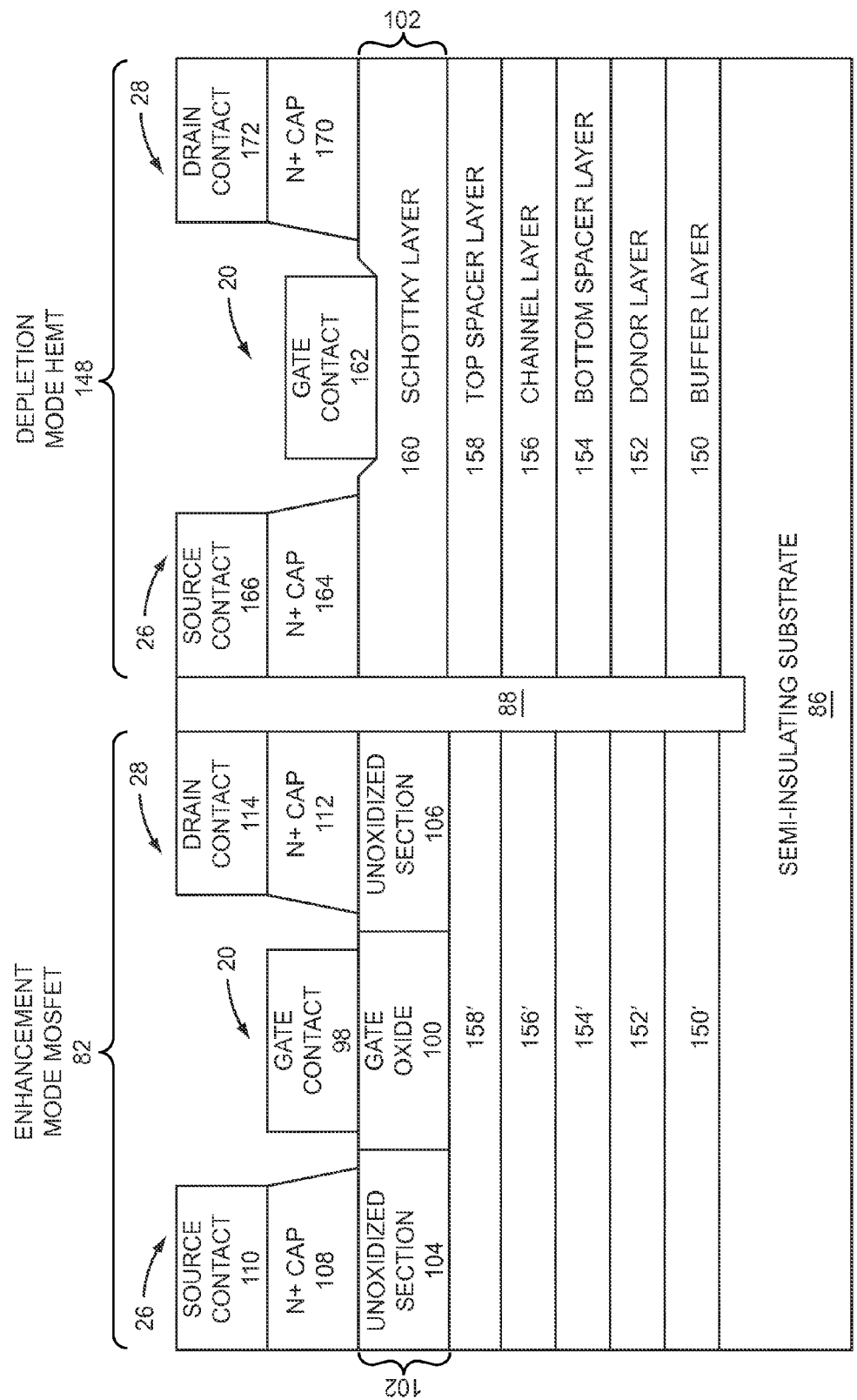
FIG. 10B is a second embodiment of an e-mode MOSFET and a d-mode HEMT provided on a common substrate according to the present invention.
Figure 10C:
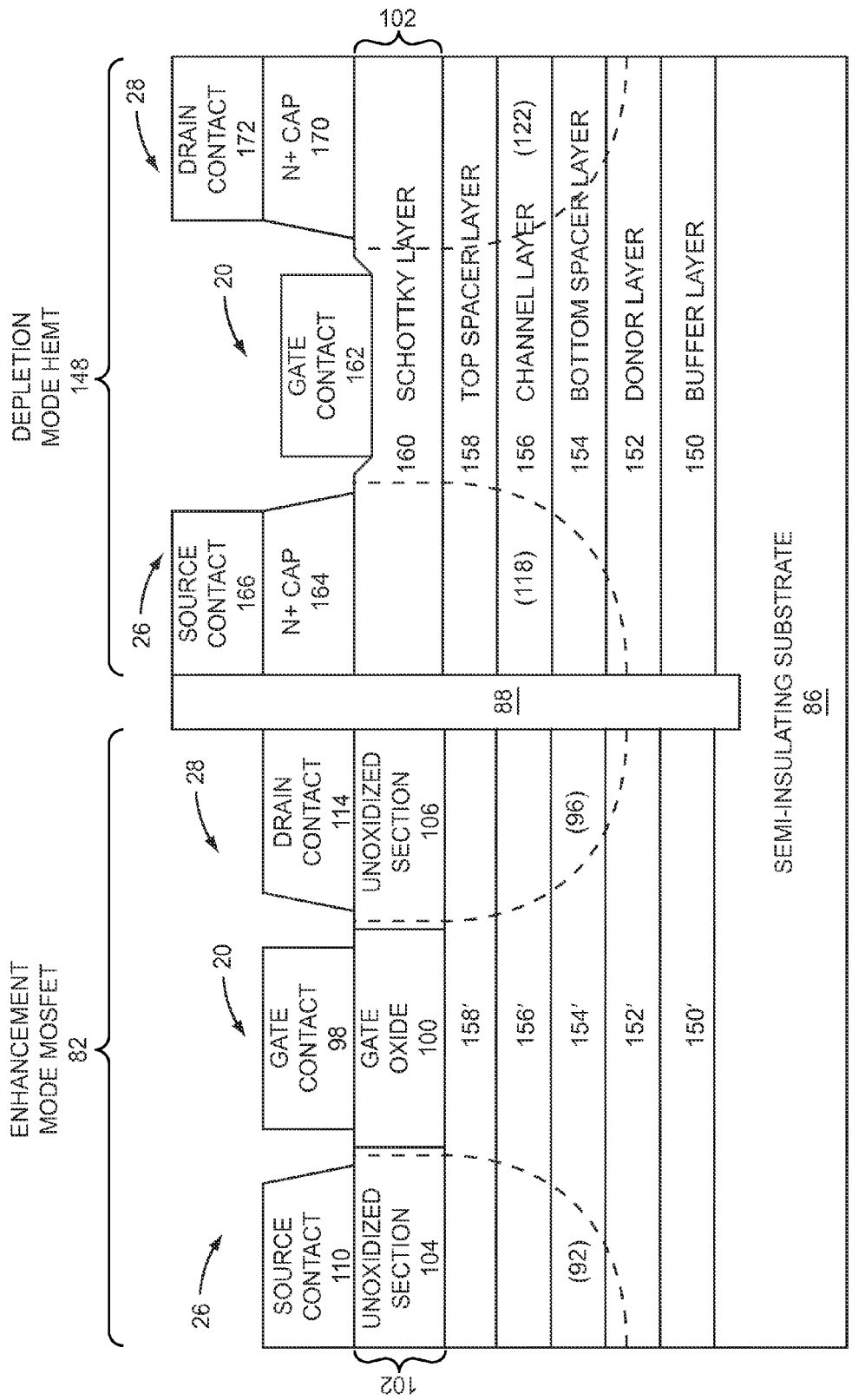

FIG. 10CA is a third embodiment of an e-mode MOSFET and a d-mode HEMT provided on a common substrate according to the present invention.

Figure 10D:
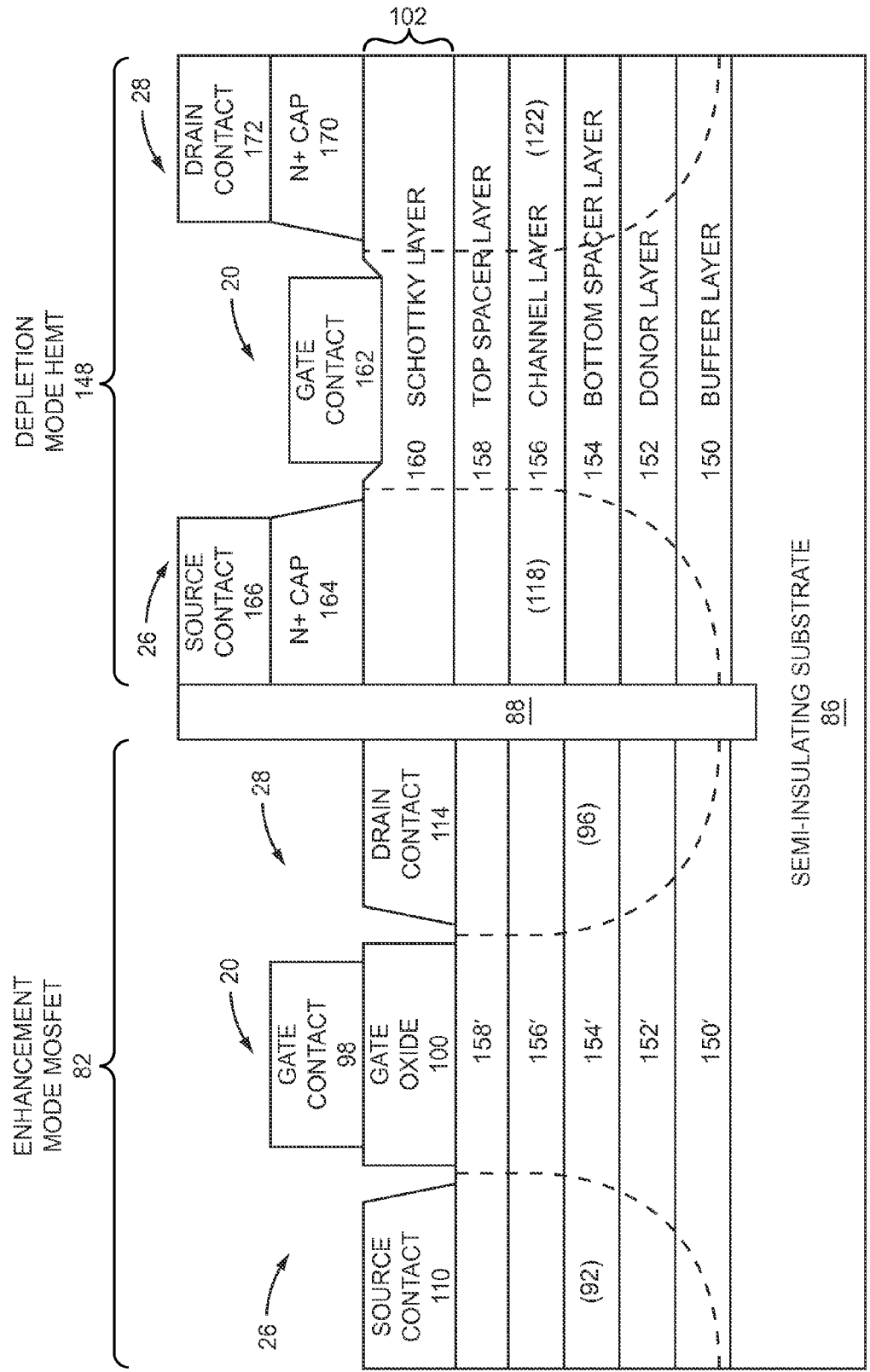

FIG. 10D is a fourth embodiment of an e-mode MOSFET and a d-mode HEMT provided on a common substrate according to the present invention.

Figure 11:
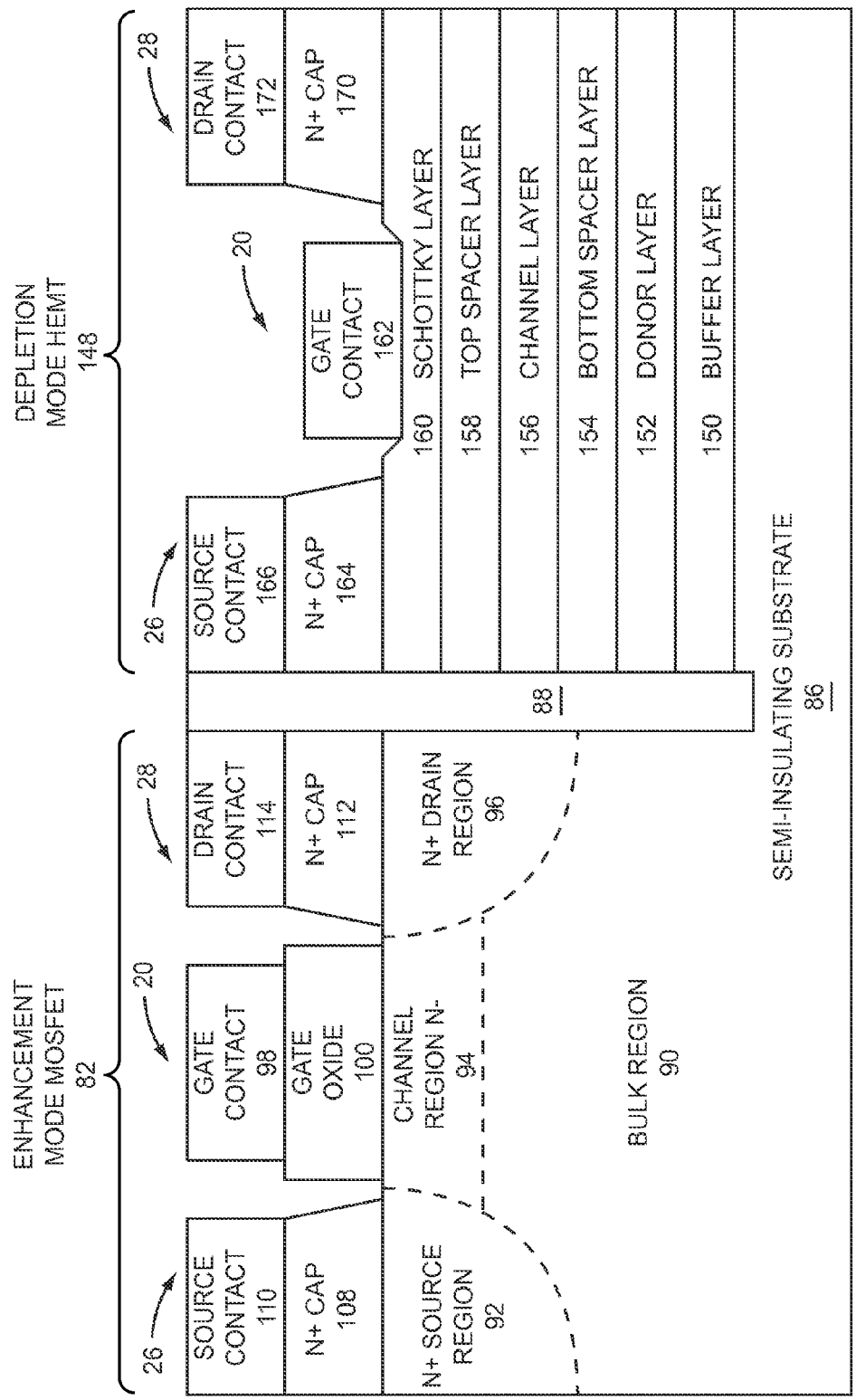

FIG. 11 is a fifth embodiment of an e-mode MOSFET and a d-mode HEMT provided on a common substrate according to the present invention.

Figure 12:
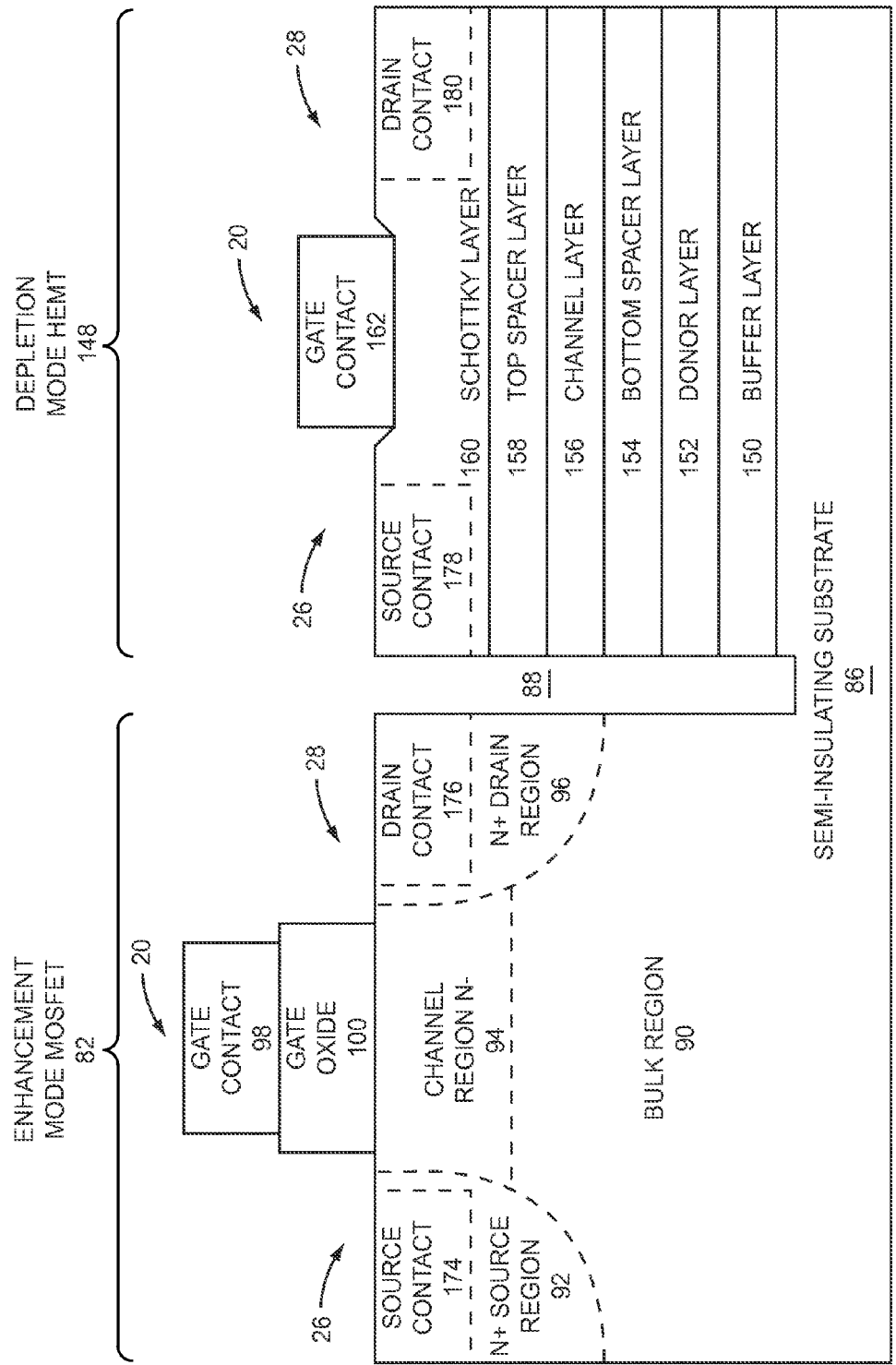

FIG. 12 is a sixth embodiment of an e-mode MOSFET and a d-mode HEMT provided on a common substrate according to the present invention.

Figure 13:
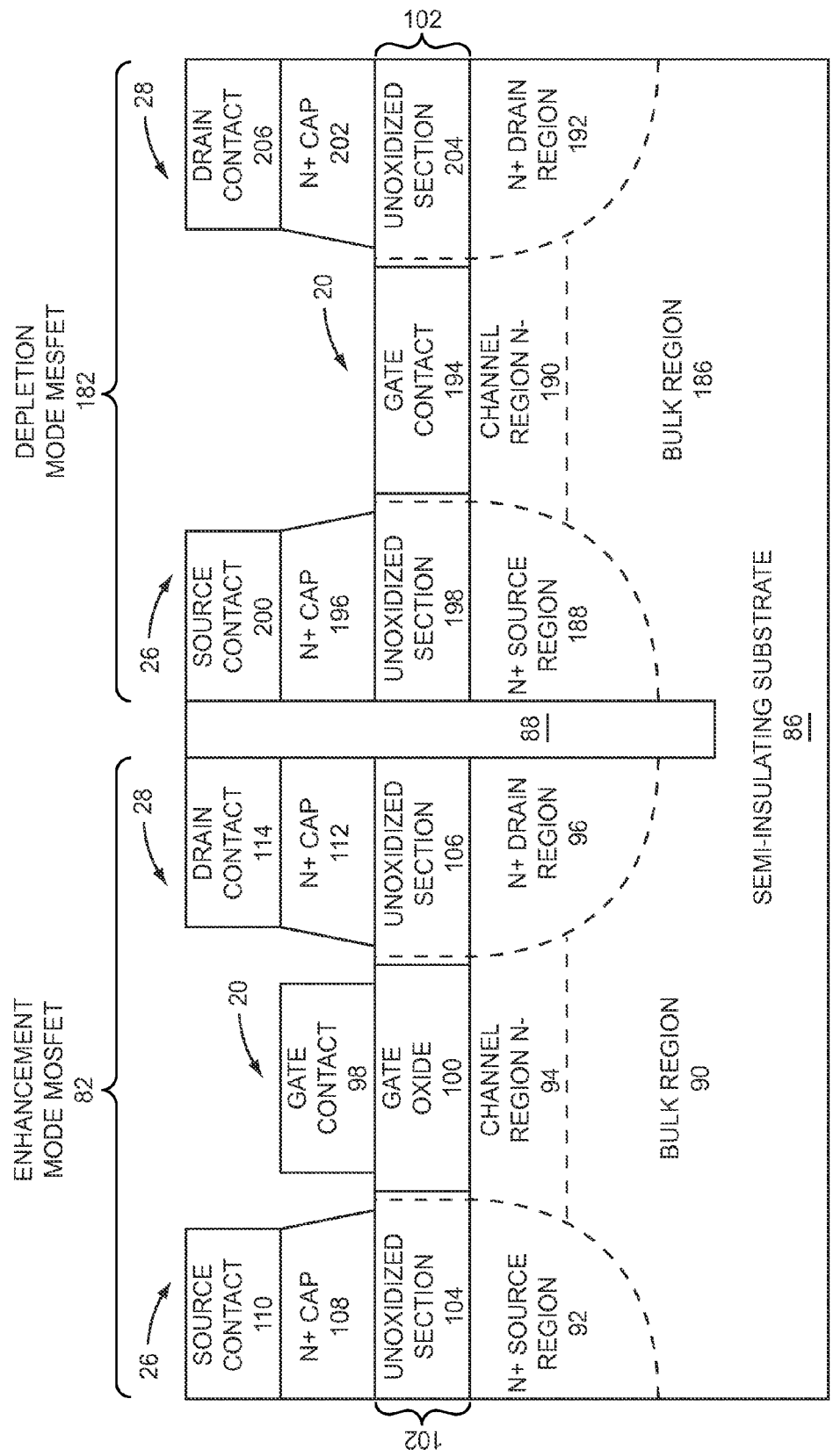

FIG. 13 is a first embodiment of an e-mode MOSFET and a d-mode MESFET provided on a common substrate according to the present invention.

Figure 14:
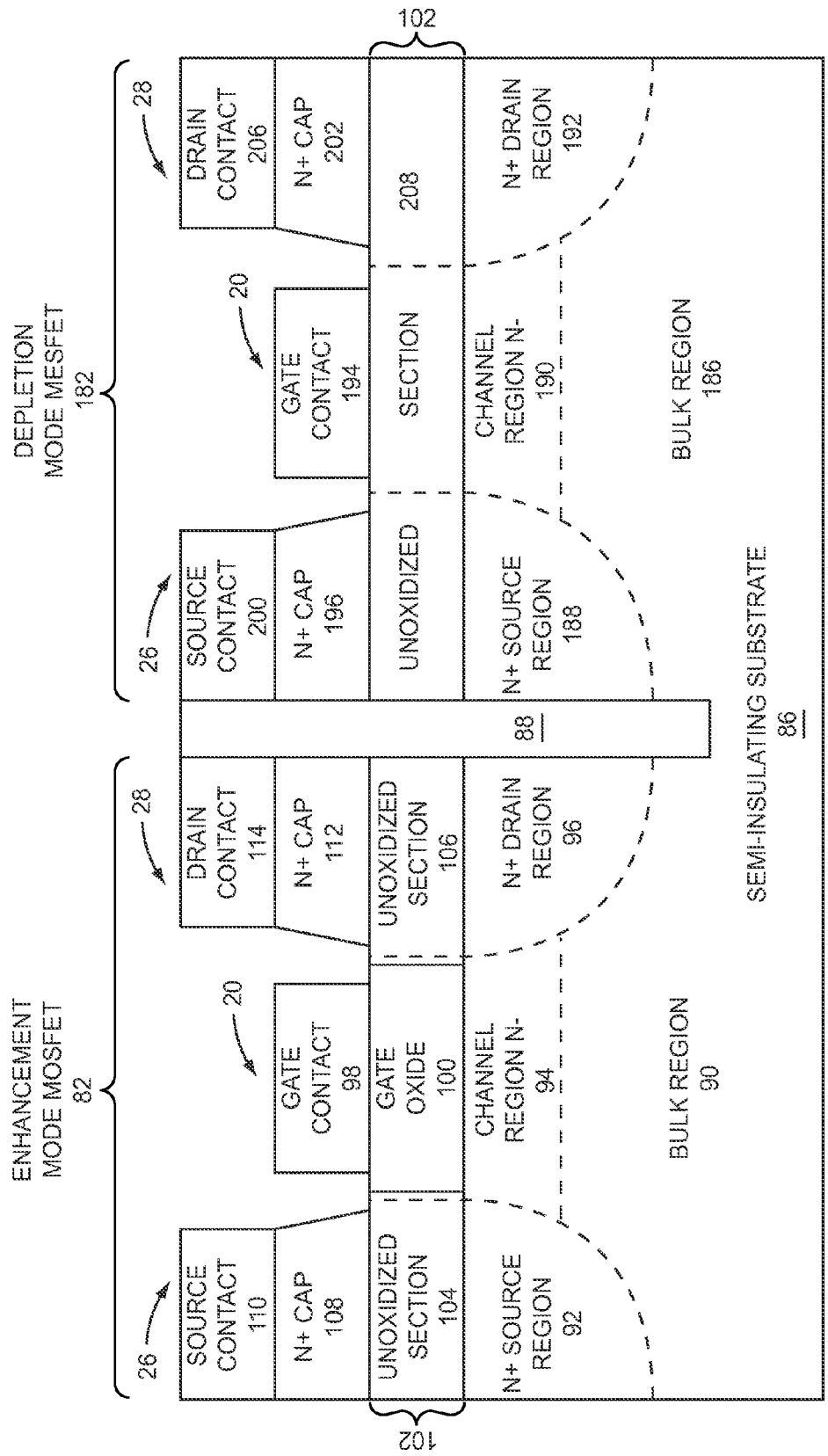

FIG. 14 is a second embodiment of an e-mode MOSFET and a d-mode MESFET provided on a common substrate according to the present invention.

Figure 15A:
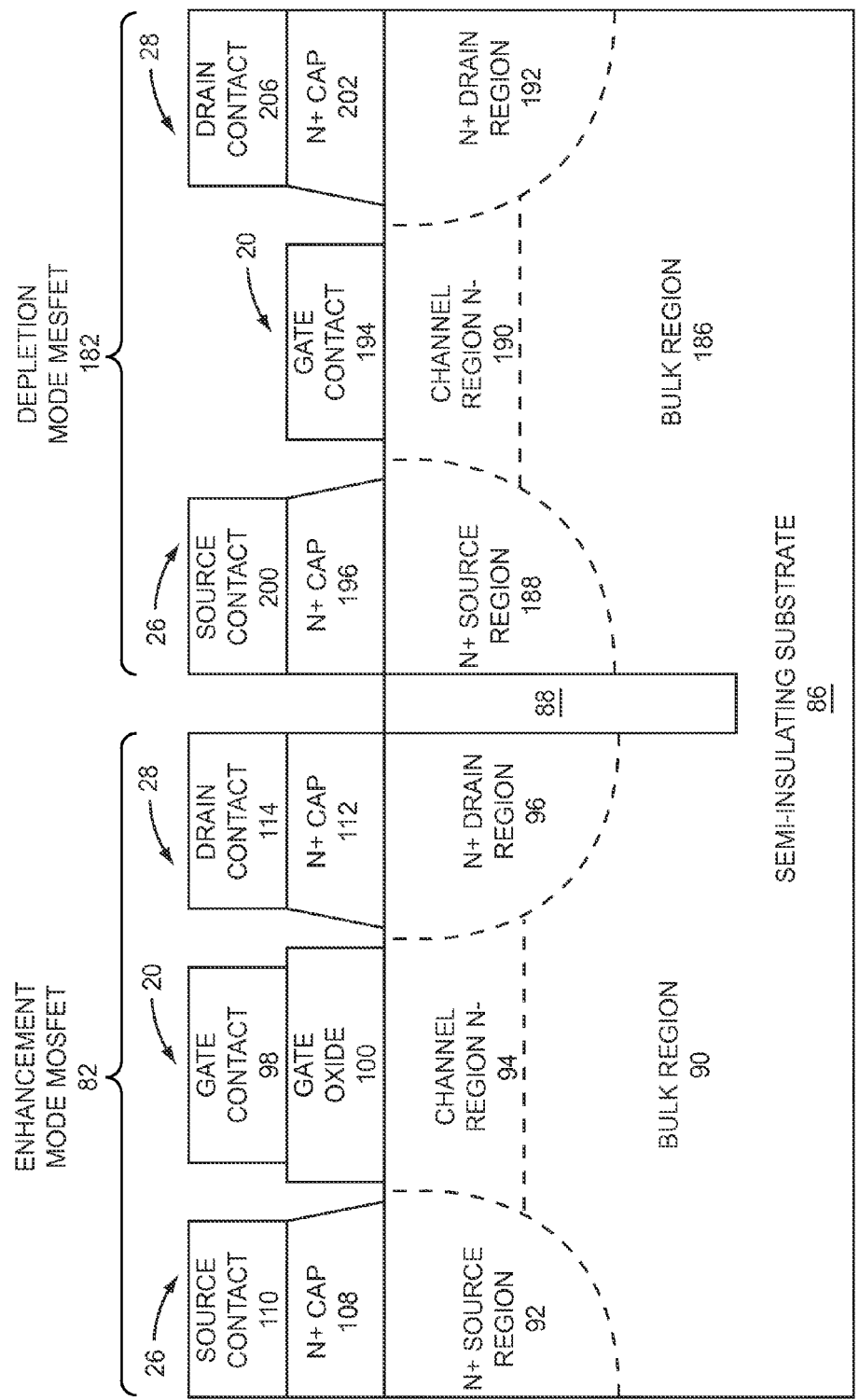

FIG. 15A is a third embodiment of an e-mode MOSFET and a d-mode MESFET provided on a common substrate according to the present invention.

Figure 15B:
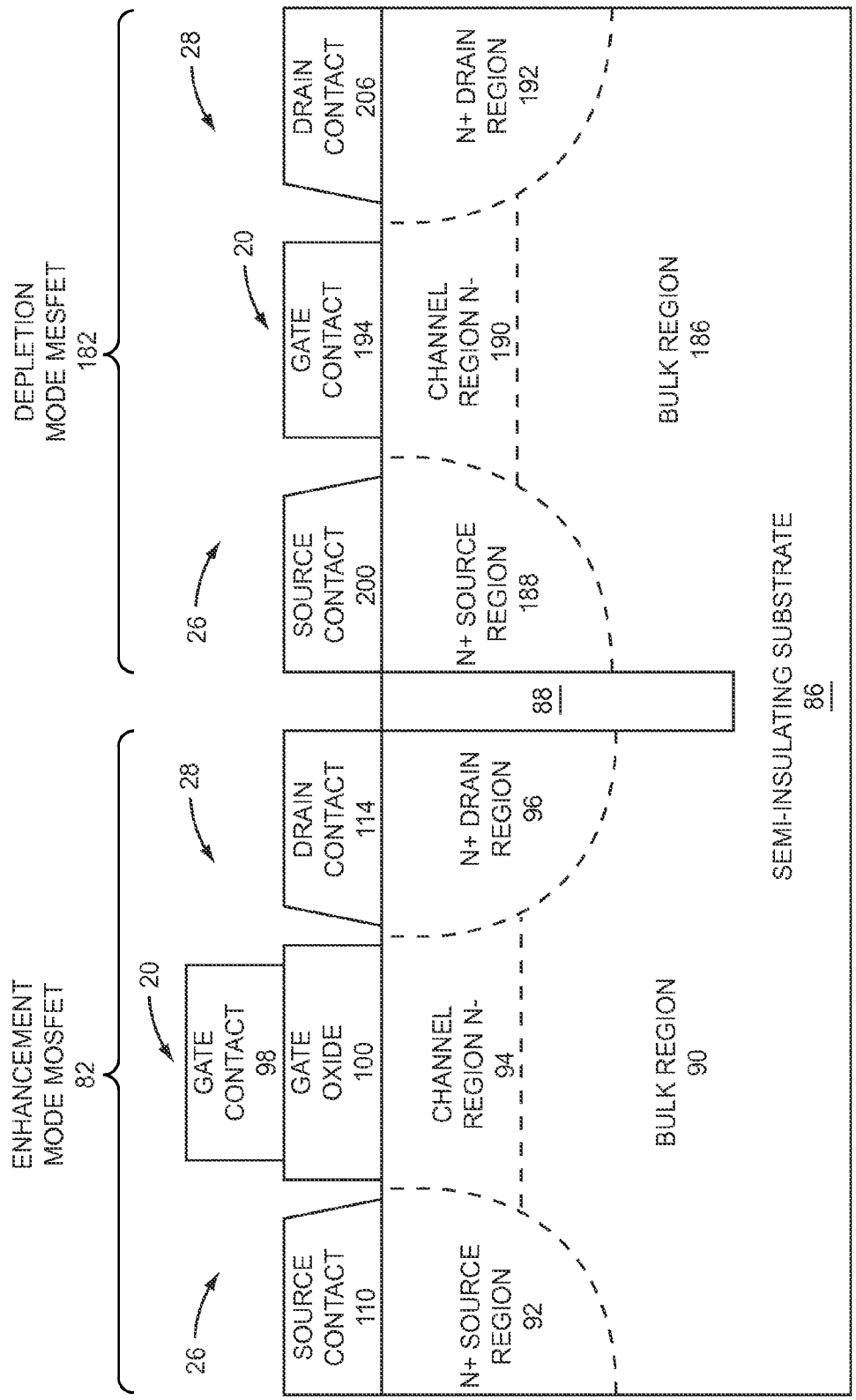

FIG. 15B is a fourth embodiment of an e-mode MOSFET and a d-mode MESFET provided on a common substrate according to the present invention.

Figure 16:
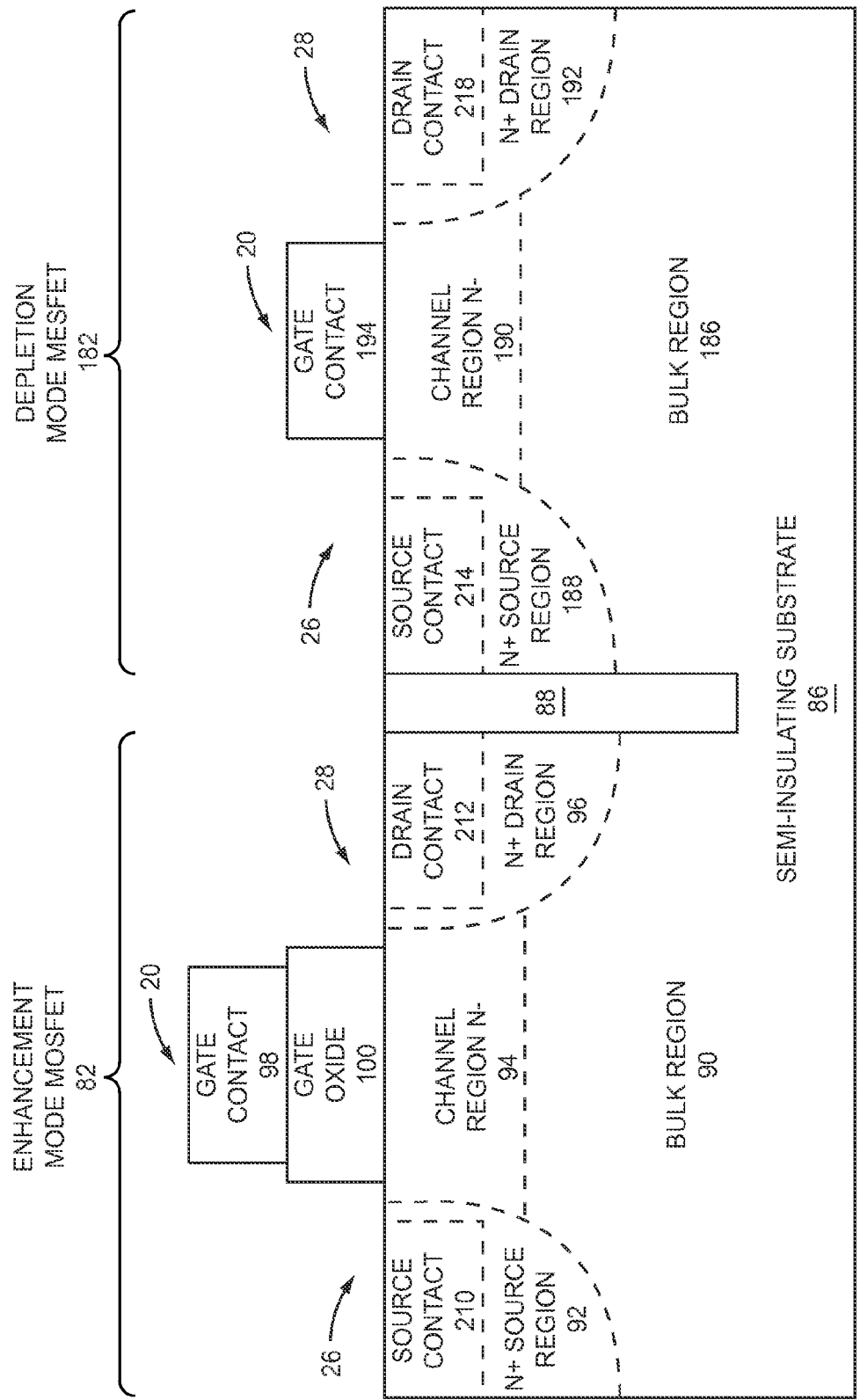

FIG. 16 is a fifth embodiment of an e-mode MOSFET and a d-mode MESFET provided on a common substrate according to the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
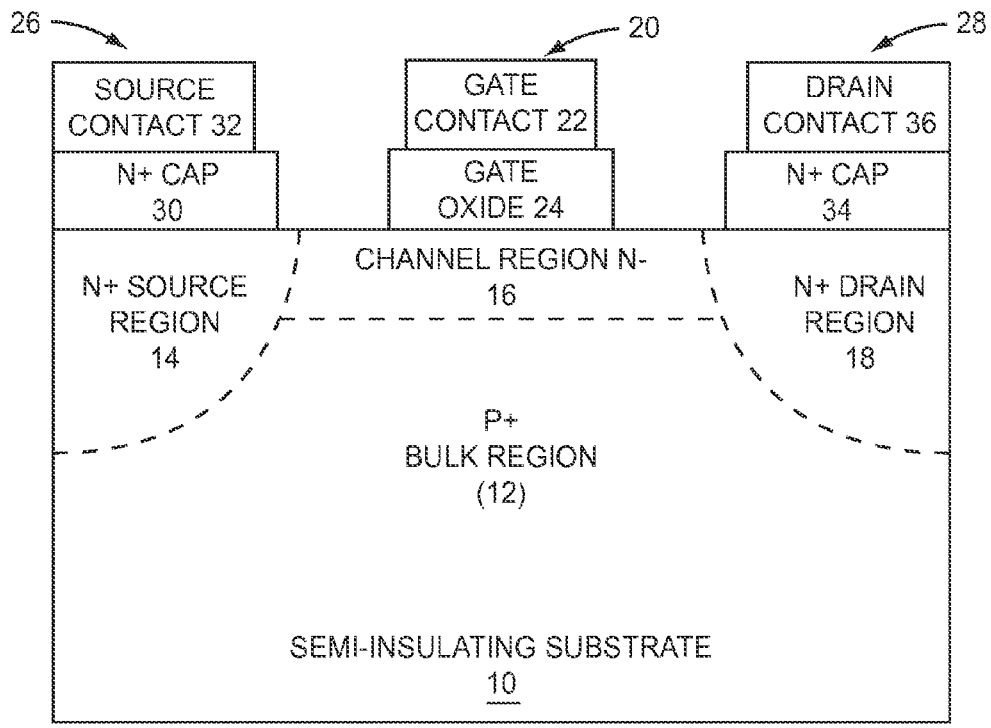
FIG. 1 is a first embodiment of a MOSFET according to the prior art.

Prior to delving into the details of the present invention, an overview of three different FET structures is provided. With reference to FIG. 1 an N-type MOSFET is illustrated according to the prior art. The N-type MOSFET is formed with a semi-insulating substrate 10 of a group III-V material system, such as GaAs. The substrate 10 includes a bulk region 12, a source region 14, a channel region 16, and a drain region 18. The bulk region 12 is heavily doped with P-type material, while the source and drain regions 14, 18 are heavily doped with N-type material. The channel region 16 may be lightly doped with N-type material and extends between the source and drain regions 14, 18. The amount of doping in the channel region 16 may control whether the MOSFET operates as an e-mode or d-mode device. The gate structure 20 for the MOSFET will include a gate contact 22 and a gate oxide 24 that acts as a dielectric to isolate the body of the MOSFET from the gate contact 22. The body of the MOSFET is roughly that portion of the structure that resides below the gate oxide 24.

Figure 2:
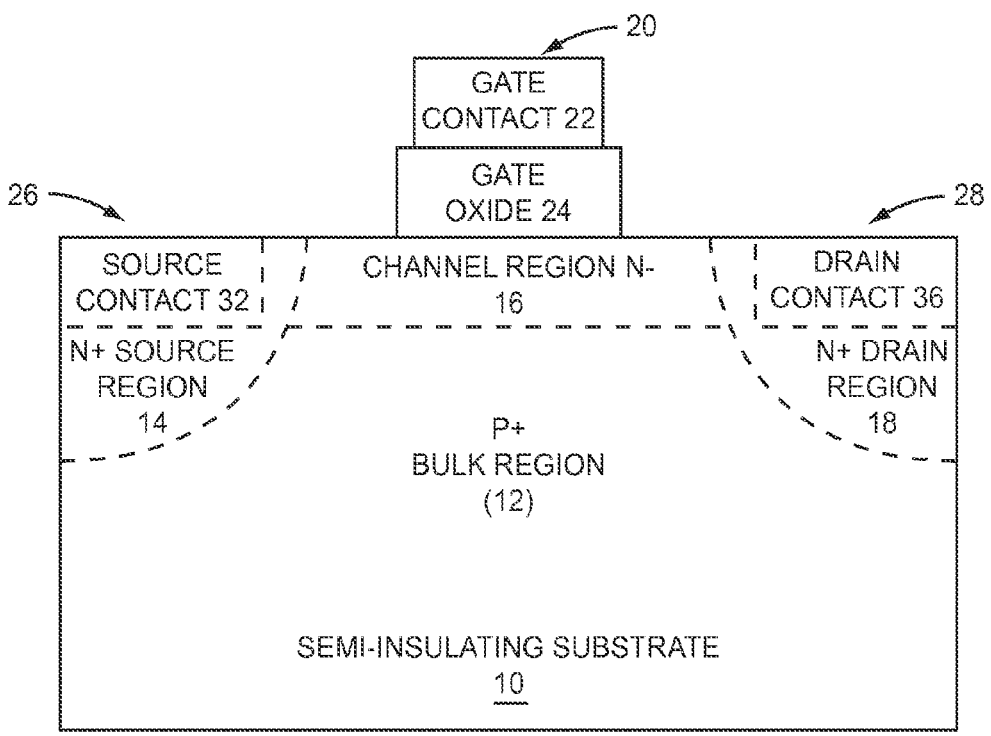
FIG. 2 is a second embodiment of a MOSFET according to the prior art.

Those skilled in the art will recognize numerous available variations in the structure of a MOSFET. For example, various source and drain structures 26, 28 are possible. The illustrated source structure 26 includes a cap 30 that resides over the source region 14 and a source contact 32 that resides over the cap 30. The cap 30 is heavily doped with N-type material to facilitate a low impedance connection between the source contact 32 and the source region 14. Similarly, the illustrated drain structure 28 includes a cap 34 that resides over the drain region 18 and a drain contact 36 that resides over the cap 34. The cap 34 is heavily doped with N-type material to facilitate a low impedance connection between the drain contact 36 and the drain region 18. In FIG. 2, another variation is illustrated for the source and drain structures 26, 28. The source structure 26 includes a source contact 32 that is buried, or implanted, into the source region 14. The drain structure 28 includes a drain contact 36 that is buried, or implanted, into the drain region 18.

Figure 3:
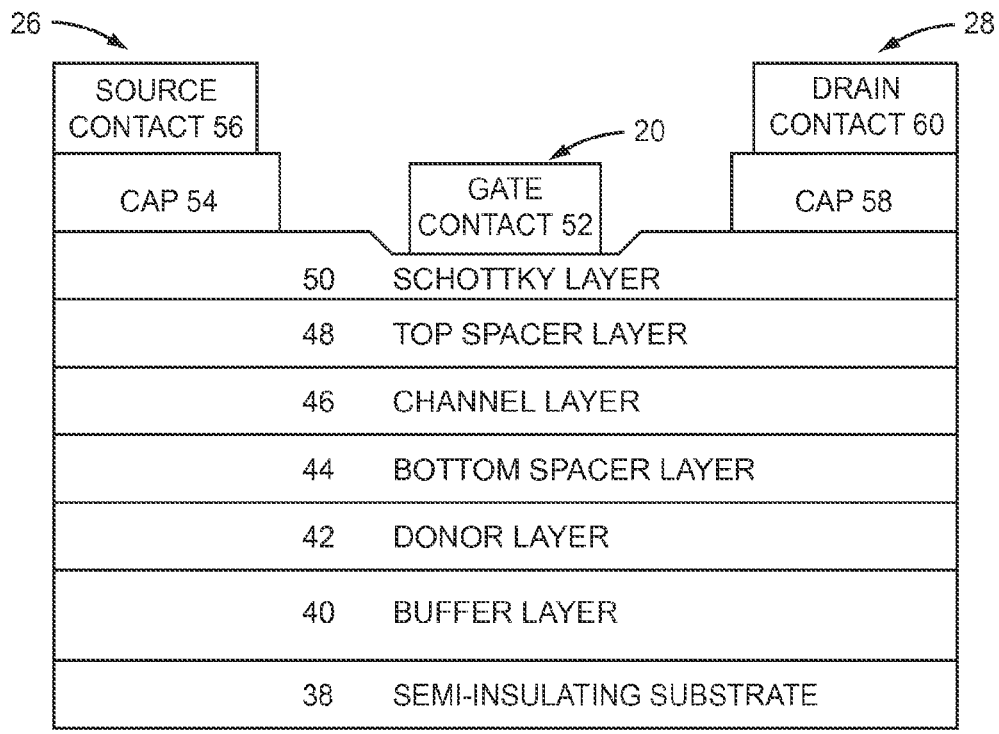
FIG. 3 is a first embodiment of a HEMT according to the prior art.

With reference to FIG. 3, an HEMT is illustrated. The HEMT includes an epitaxial structure that is formed on a semi-insulating substrate 38. An exemplary epitaxial structure is illustrated to include a buffer layer 40, a donor layer 42, a bottom spacer layer 44, a channel layer 46, a top spacer layer 48, and a Schottky layer 50. The gate structure 20 simply includes a gate contact 52, which resides in Schottky contact with the Schottky layer 50. As such, there is no oxide or like dielectric to insulate the gate contact 52 from the Schottky layer 50.

Typically, the channel layer 46 is undoped and is formed from either Indium Gallium Arsenide (InGaAs) or GaAs in group III-V material systems. The bottom and top spacer layers 44, 48, along with the donor layer 42, are generally optional. The Schottky layer 50 is generally uniformly doped or includes planar doping, where a very thin layer of doping is provided near the interface with the channel layer 46. The donor layer 42 may be doped in the same manner as the Schottky layer 50. The portions of the Schottky layer 50 and the donor layer 42, if present, that reside below the gate contact 52 may be generally referred to as a sub-gate area (not illustrated).

Figure 4:
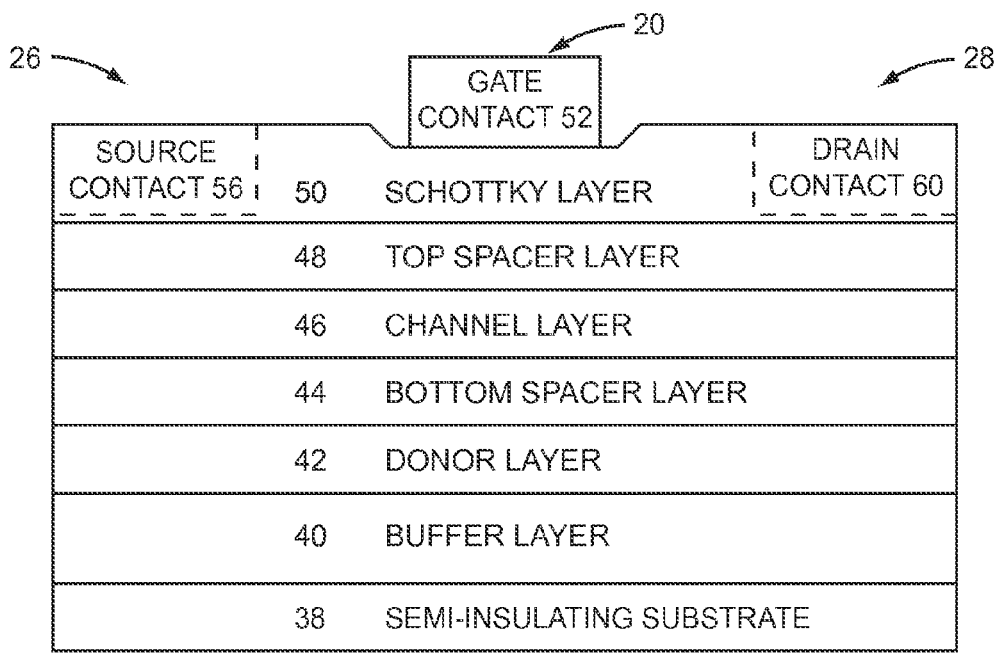
FIG. 4 is a second embodiment of a HEMT according to the prior art.

The illustrated source structure 26 includes a cap 54 that resides on one side of the gate contact 52 and a source contact 56 that resides over the cap 54. The cap 54 is heavily doped with N-type material to facilitate a low impedance connection between the source contact 56 and the underlying HEMT structure. Similarly, the illustrated drain structure 28 includes a cap 58 that resides on the other side of the gate contact 52 and a drain contact 60 that resides over the cap 58. The cap 58 is heavily doped with N-type material to facilitate a low impedance connection between the drain contact 60 and the underlying HEMT structure. In FIG. 4 another variation is illustrated for the source and drain structures 26, 28. The source structure 26 includes a source contact 56 that is buried, or implanted, into the underlying HEMT structure. The drain structure 28 includes a drain contact 60 that is buried, or implanted, into the underlying HEMT structure.

Figure 5:
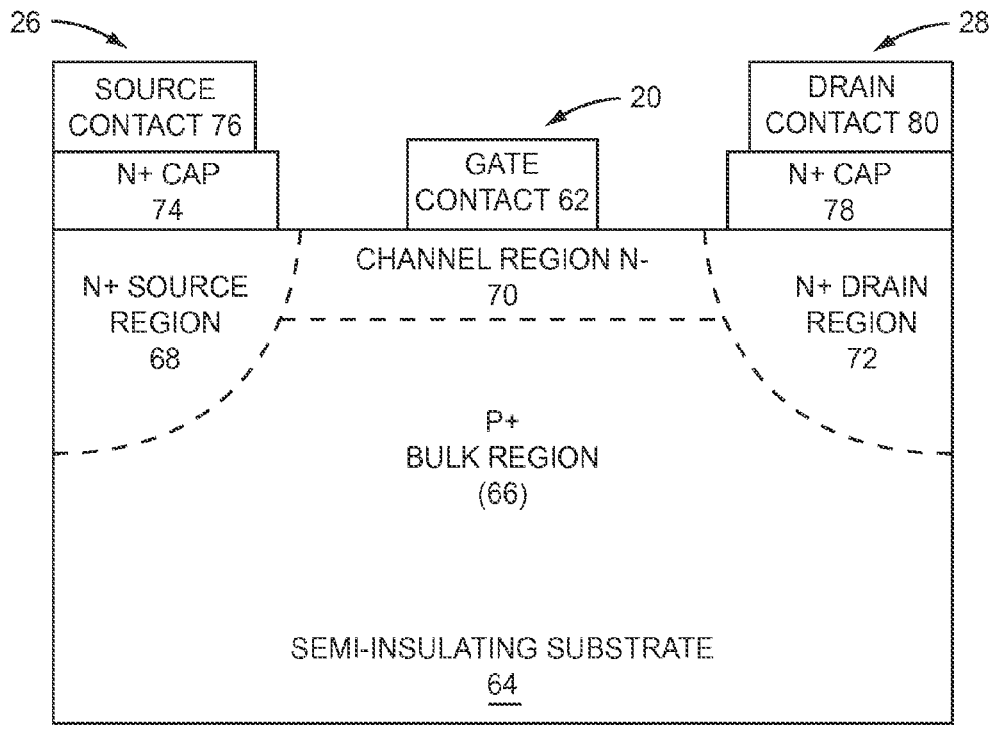
FIG. 5 is a first embodiment of a MESFET according to the prior art.

With reference to FIG. 5 a MESFET is illustrated. The structure of the MESFET is similar to that of the MOSFET, with the exception that the gate structure 20 does not include a gate oxide 24 or like dielectric. As such, a gate contact 62 is in Schottky contact with the channel region 70 in the body of the MESFET. In particular, MESFET is formed with a semi-insulating substrate 64 of a group III-V material system. The substrate 64 includes a bulk region 66, a source region 68, a channel region 70, and a drain region 72. The bulk region 66 is heavily doped with P-type material, while the source and drain regions 68, 72 are heavily doped with N-type material. The channel region 70 may be lightly doped with N-type material and extends between the source and drain regions 68, 70. The amount of doping in the channel region 70 may control whether the MESFET operates as an e-mode or d-mode device.

Figure 6:
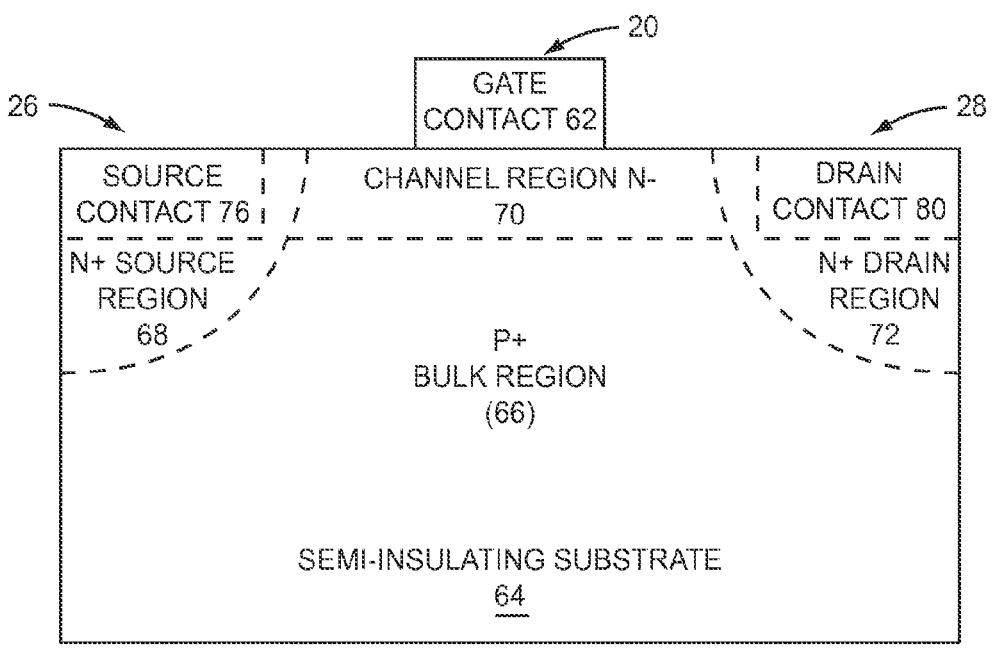
FIG. 6 is a second embodiment of a MESFET according to the prior art.

As with the MOSFET and HEMT, those skilled in the art will recognize numerous available variations in the structure of a MESFET. For example, various source and drain structures 26, 28 are possible. The illustrated source structure 26 includes a cap 74 that resides over the source region 68 and a source contact 76 that resides over the cap 74. The cap 74 is heavily doped with N-type material to facilitate a low impedance connection between the source contact 76 and the source region 68. Similarly, the illustrated drain structure 28 includes a cap 78 that resides over the drain region 72 and a drain contact 80 that resides over the cap 78. The cap 78 is heavily doped with N-type material to facilitate a low impedance connection between the drain contact 80 and the drain region 72. In FIG. 6 another variation is illustrated for the source and drain structures 26, 28. The source structure 26 includes a source contact 76 that is buried, or implanted, into the source region 68. The drain structure 28 includes a drain contact 80 that is buried, or implanted, into the drain region 72.

The present invention relates to providing an e-mode MOSFET with a complementary d-mode FET. Preferably, the e-mode MOSFET and the d-mode FET are provided on a common substrate. The depletion mode FET may be another MOSFET, a MESFET, a HEMT, or like FET structure. In general, the e-mode MOSFET includes a gate structure that resides between source and drain structures on a transistor body. The gate structure includes a gate contact that is separated from the transistor body by a gate oxide. The gate oxide is preferably formed by oxidizing at least a portion of an oxidizable material layer that includes both Aluminum and Phosphorus. For example, the oxidizable material layer may be formed of Aluminum Phosphide (AlP), Indium Aluminum Phosphide (InAlP), and Indium Aluminum Gallium Phosphide (InAlGaP). In certain embodiments, the gate oxide will include Aluminum and Phosphorus, but will include essentially no Arsenic (As) The use of InAlP as the oxidizable material layer has proven to work well, especially when no or an insubstantial amount of As is present. The gate oxide resides beneath the gate contact, which may be formed from one or any combination of Aluminum (Al), Gold (Au). Platinum (Pt), Titanium (Ti), and the like.

Figure 7:
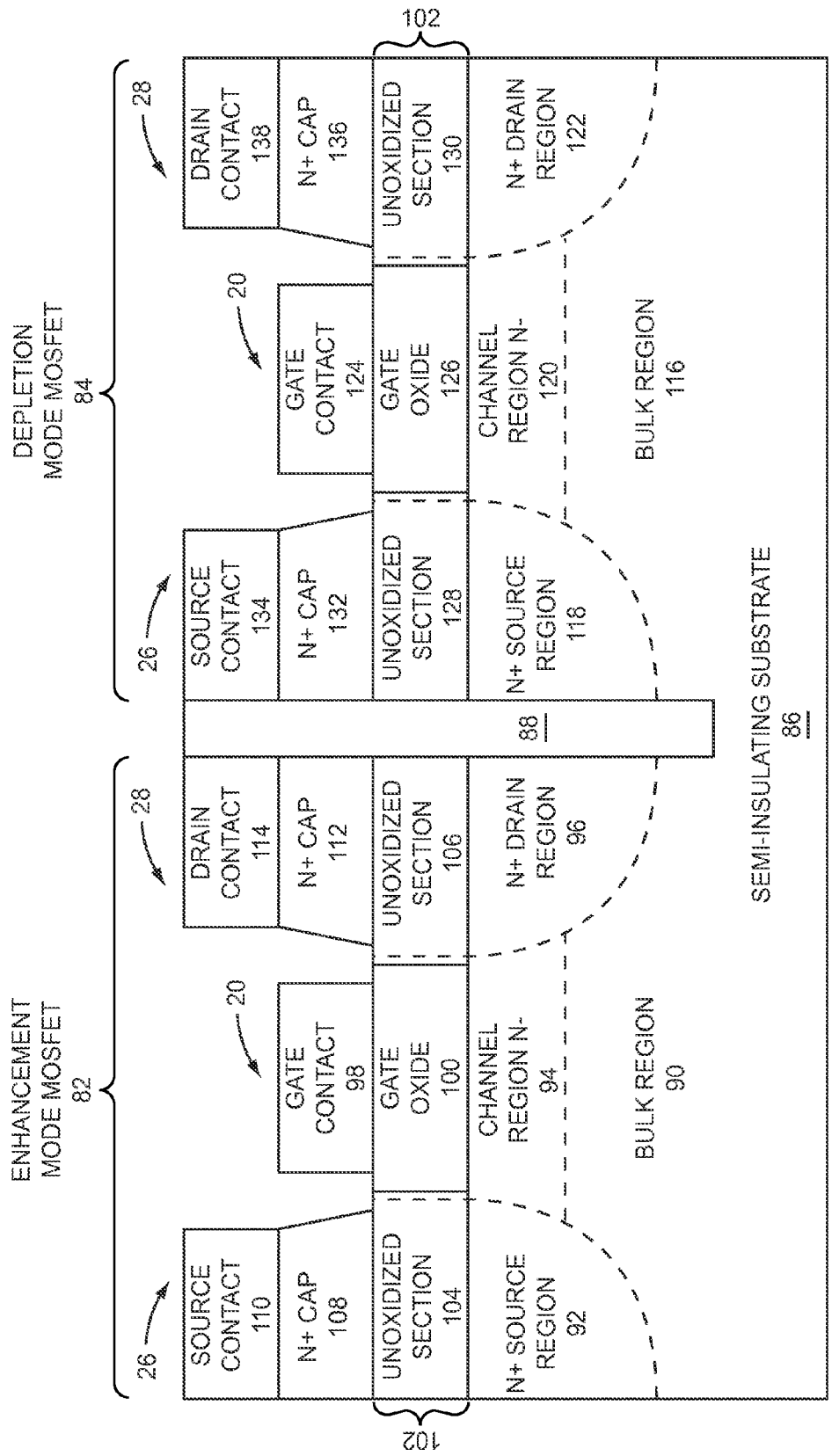
FIG. 7 is a first embodiment of an e-mode MOSFET and a d-mode MOSFET provided on a common substrate according to the present invention.

With reference to FIG. 7, a first embodiment of the present invention is illustrated. In particular, an e-mode MOSFET 82 and a d-mode MOSFET 84 are formed on the same group III-V, semi-insulating substrate 86, which is preferably formed from GaAs. The e-mode MOSFET 82 is substantially separated from the d-mode MOSFET 84 by a field isolation region 88, which may be formed from an oxide or like insulating material. For the e-mode MOSFET 82, the substrate 86 includes a bulk region 90, a source region 92, a channel region 94, and a drain region 96. In one embodiment, the bulk region 90 is heavily doped with P-type material, while the source and drain regions 92, 96 are heavily doped with N-type material. Notably, the bulk region 90 may remain undoped and still provide strong performance. The channel region 94 may be lightly doped with N-type material and extends between the source and drain regions 92, 96. The amount of doping in the channel region 94 is may be controlled to ensure the e-mode MOSFET 82 operates as an e-mode device and in a substantially complementary fashion with respect to the d-mode MOSFET 84. The gate structure 20 for the e-mode MOSFET 82 will include a gate contact 98 and a gate oxide 100 that acts as a dielectric to isolate the body of the e-mode MOSFET 82 from the gate contact 98.

Notably, the gate oxide 100 is formed from an oxidizable material layer 102. In particular, the gate oxide 100 is formed from an oxidized portion of the oxidizable material layer 102. In this embodiment, both the source and drain structures 26, 28 reside over unoxidized sections 104, 106 of the oxidizable material layer 102. Portions of the unoxidized sections 104, 106 may be heavily doped with N-type material along with the source and drain regions 92, 96, and thus may be considered part of the source and drain regions 92 and 96.

The illustrated source structure 26 includes a cap 108 that resides over the unoxidized section 104 of oxidizable material layer 102 over the source region 92. A source contact 110 resides over the cap 108. The cap 108 is heavily doped with N-type material to facilitate a low impedance connection between the source contact 110 and the source region 92. Similarly, the illustrated drain structure 28 includes a cap 112 that resides over the unoxidized section 106 of the oxidizable material layer 102 over the drain region 96. A drain contact 114 resides over the cap 112. The cap 112 is heavily doped with N-type material to facilitate a low impedance connection between the drain contact 114 and the drain region 96.

For the d-mode MOSFET 84, the substrate 86 includes a bulk region 116, a source region 118, a channel region 120, and a drain region 122. In one embodiment, the bulk region 116 is heavily doped with P-type material, while the source and drain regions 118, 122 are heavily doped with N-type material. The channel region 120 may be lightly doped with N-type material and extends between the source and drain regions 118, 122. Notably, the bulk region 116 may remain undoped. The amount of doping in the channel region 120 is preferably controlled to ensure the d-mode MOSFET 84 operates as a d-mode device and in a substantially complementary fashion with respect to the e-mode MOSFET 82. The gate structure 20 for the d-mode MOSFET 84 will include a gate contact 124 and a gate oxide 126 that acts as a dielectric to isolate the body of the d-mode MOSFET 84 from the gate contact 124.

As illustrated, the gate oxide 126 for the d-mode MOSFET 84 is formed from the oxidizable material layer 102, which is the same layer from which the gate oxide 100 for the e-mode MOSFET 82 was formed. As described above with respect to the e-mode MOSFET 82, the gate oxide 126 is formed from an oxidized portion of the oxidizable material layer 102. In this embodiment, both the source and drain structures 26, 28 reside over unoxidized sections 128, 130 of the oxidizable material layer 102. Portions of the unoxidized sections 128, 130 may be heavily doped with N-type material along with the source and drain regions 118, 122 and thus may be considered part of the source and drain regions 118, 122.

The illustrated source structure 26 includes a cap 132 that resides over the unoxidized section 128 of oxidizable material layer 102 over the source region 118. A source contact 134 resides over the cap 132. The cap 132 is heavily doped with N-type material to facilitate a low impedance connection between the source contact 134 and the source region 118. Similarly, the illustrated drain structure 28 includes a cap 136 that resides over the unoxidized section 130 of the oxidizable material layer 102 for the drain region 122. A drain contact 138 resides over the cap 136. The cap 136 is heavily doped with N-type material to facilitate a low impedance connection between the drain contact 138 and the drain region 122.

In the above embodiment, the gate oxide 126 for the d-mode MOSFET 84 is an oxidized portion of the oxidizable material and is preferably formed by oxidizing another portion of the same oxidizable layer 102 that was used to form the gate oxide 100 of the e-mode MOSFET 82. Further, the unoxidized sections of the oxidizable material layer 102, such as sections 104, 106, 128, and 130, remained unoxidized and are doped with N-type material to form low impedance connections between the corresponding source and drain structures 26, 28, and the underlying source and drain regions 92, 96, 118, 122.

Figure 8A:
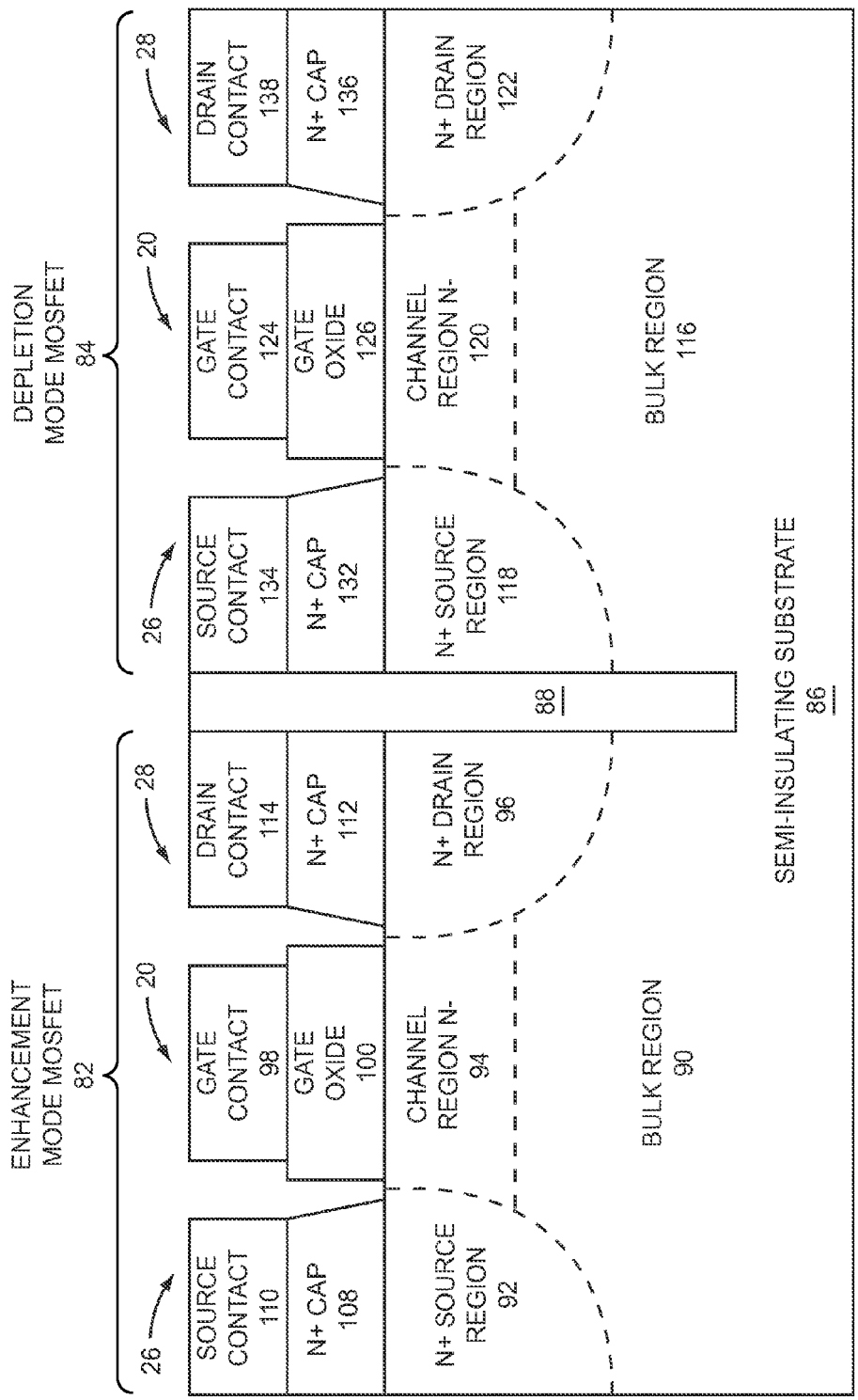
FIG. 8A is a second embodiment of an e-mode MOSFET and a d-mode MOSFET provided on a common substrate according to the present invention.
Figure 8B:
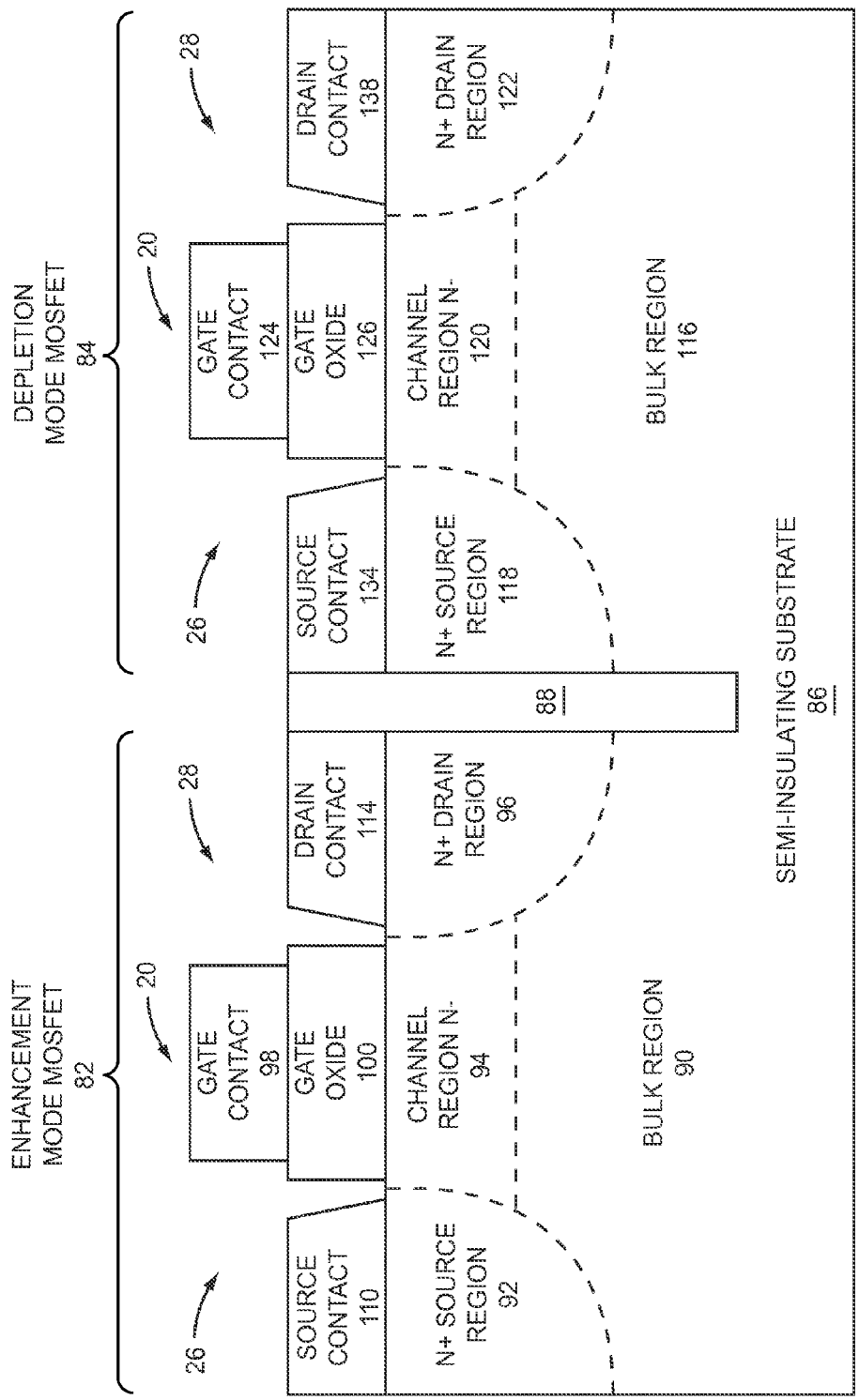
FIG. 8B is a third embodiment of an e-mode MOSFET and a d-mode MOSFET provided on a common substrate according to the present invention.

In an alternative embodiment, all or most of those portions of the oxidizable material layer 102 that are not used to form gate oxides, such as the gate oxide 100 for the e-mode MOSFET 82 and the gate oxide 126 for the d-mode MOSFET 84, are etched away. As illustrated in FIG. 8A, the unoxidized sections 104, 106, 128, and 130 of the e-mode MOSFET 82 and the d-mode MOSFET 84, respectively, are etched away prior to forming the source and drain structures 26, 28 for the devices. Accordingly, caps 108, 112, 128, and 130 reside substantially directly on the bodies of the e-mode MOSFET 82 and the d-mode MOSFET 84. No part of the oxidizable material layer 102 resides between the caps 108, 112, 128, and 130 and the bodies of the e-mode MOSFET 82 and the d-mode MOSFET 84. As illustrated in FIG. 8B, the caps 108, 112, 128, and 130 may be removed to allow the source contacts 108, 132 and drain contacts 112, 136 to reside on the bulk region 90.

Figure 9:
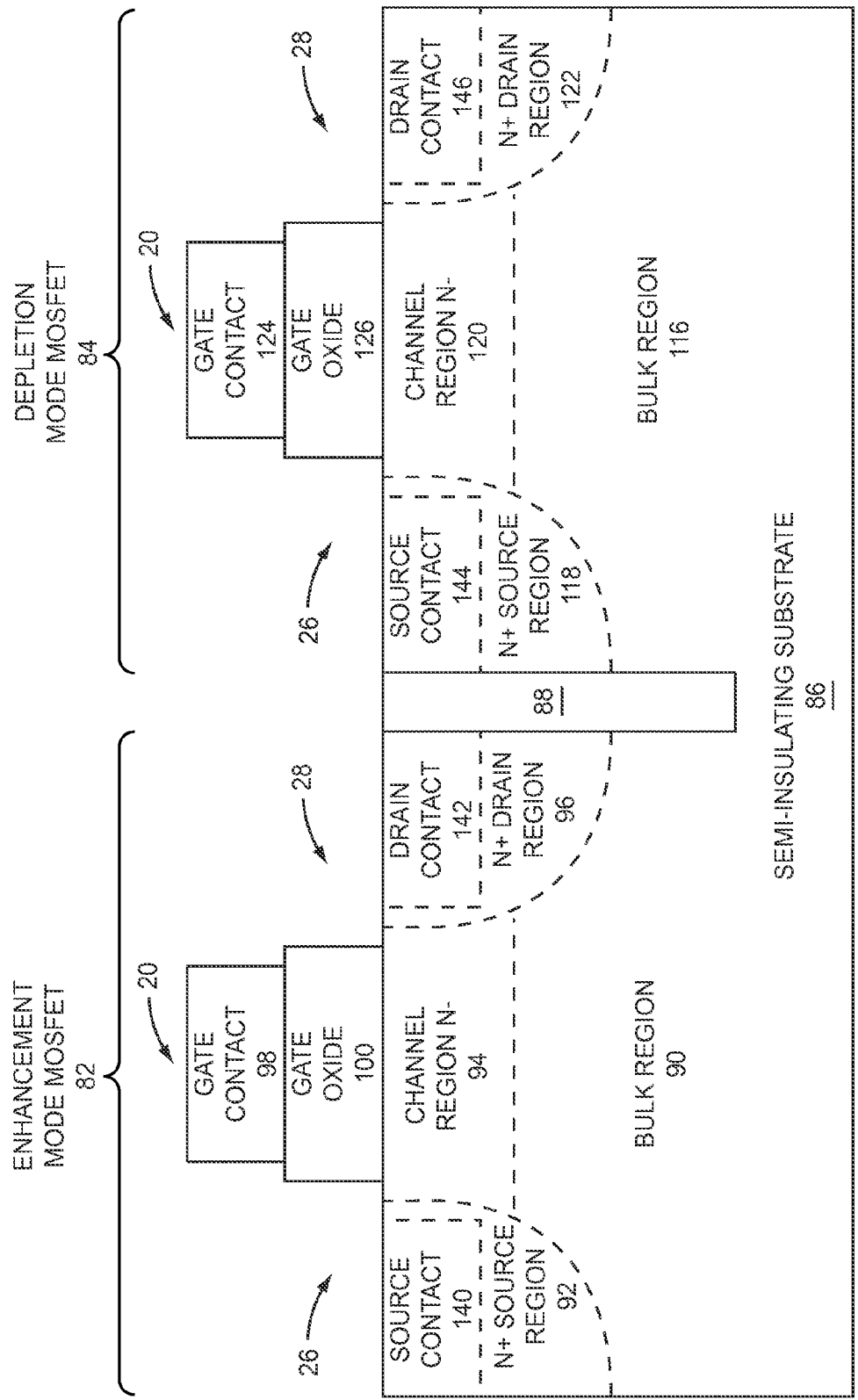
FIG. 9 is a third embodiment of an e-mode MOSFET and a d-mode MOSFET provided on a common substrate according to the present invention.

Those skilled in the art will recognize numerous variations of the invention concepts. These variations may include providing additional layers between elements of the devices, modifying the bodies of the devices, and modifying the structures of the devices. For example, a variation on the source and drain structures 26, 28 is provided in FIG. 9. In this example, assume those portions of the oxidizable material layer 102 that are not used to form the gate oxides 100, 126 for the e-mode MOSFET 82 and the d-mode MOSFET 84, respectively, have been etched away as described in association with FIG. 8A. As such, the source structure 26 for the e-mode MOSFET 82 includes a source contact 140 that is buried, or implanted, into the source region 92. The drain structure 28 for the e-mode MOSFET 82 includes a drain contact 142 that is buried, or implanted, into the drain region 96. Similarly, the source structure 26 for the d-mode MOSFET 84 includes a source contact 144 that is buried, or implanted, into the source region 118. The drain structure 28 for the d-mode MOSFET 84 includes a drain contact 146 that is buried, or implanted, into the drain region 122.

As illustrated in FIG. 10A, the e-mode MOSFET 82 is formed on the same substrate 86 with a d-mode HEMT 148 according to another embodiment of the present invention. In the illustrated embodiment, the e-mode MOSFET 82 is configured the same as that provided in FIG. 7. Again, a field isolation region 88 is used to isolate the two FET devices from each other. The d-mode HEMT 148 is formed on the same semi-insulating group III-V substrate 86 on which the e-mode MOSFET 82 is formed.

The d-mode HEMT 148 may be configured to include an epitaxial structure that is formed on the substrate 86. The depicted epitaxial structure includes a buffer layer 150, a donor layer 152, a bottom spacer layer 154, a channel layer 156, a top spacer layer 158, and a Schottky layer 160. The gate structure 20 of the d-mode HEMT 148 simply includes a gate contact 162, which resides in Schottky contact with or in the Schottky layer 160. As such, there is no oxide or like dielectric to insulate the gate contact 162 from the Schottky layer 160.

Typically, the channel layer 156 is undoped and is formed from either Indium Gallium Arsenide (InGaAs) or GaAs in group III-V material systems. The bottom and top spacer layers 154, 158 along with the donor layer 152 are generally optional. The Schottky layer 160 and the donor layer 152, if present, are generally uniformly doped or include planar doping where a very thin layer of doping is provided near the interfaces with the channel layer 156. As illustrated, the Schottky layer 160 is formed from an unoxidized section of the oxidizable material layer 102. As such, the Schottky layer 160 is formed from the same oxidizable material layer 102 that was used to form the gate oxide 100 of the e-mode MOSFET. The portion of the oxidizable material layer 102 that provides the gate oxide 100 may be selectively oxidized.

As described further above, the channel region 94 of the e-mode MOSFET 82 may be lightly doped with N-type material and extends between the source and drain regions 92, 96. The amount of doping in the channel region 94 is preferably controlled to ensure the e-mode MOSFET 82 operates as an e-mode device and in a substantially complementary fashion with respect to the d-mode HEMT 148. For the d-mode HEMT 148, the amount of effective doping in the Schottky layer 160, donor layer 152, and the like is preferably controlled to ensure that the d-mode HEMT 148 operates as a d-mode device and in a substantially complementary fashion with respect to the e-mode MOSFET 82. Those portions of the Schottky layer 160 and donor layer 152 are considered a sub-gate area.

The illustrated source structure 26 includes a cap 164 that resides on one side of the gate contact 162 and a source contact 166 that resides over the cap 164. The cap 164 is heavily doped with N-type material to facilitate a low impedance connection between the source contact 166 and the underlying HEMT body. Similarly, the illustrated drain structure 28 for the d-mode HEMT 148 includes a cap 170 that resides on the other side of the gate contact 162 and a drain contact 172 that resides over the cap 170. The cap 170 is heavily doped with N-type material to facilitate a low impedance connection between the drain contact 172 and the underlying HEMT body.

As illustrated in FIG. 10B, the e-mode MOSFET 82 is formed on the same substrate 86 with a d-mode HEMT 148 according to another embodiment of the present invention. Again, a field isolation region 88 is used to isolate the two FET devices from each other. The d-mode HEMT 148 is formed on the same semi-insulating group III-V substrate 86 and supporting epitaxial structure on which the e-mode MOSFET 82 is formed.

The d-mode HEMT 148 may be configured to include an epitaxial structure that is formed on the substrate 86. The depicted epitaxial structure includes a buffer layer 150, a donor layer 152, a bottom spacer layer 154, a channel layer 156, a top spacer layer 158, and a Schottky layer 160. The gate structure 20 of the d-mode HEMT 148 simply includes a gate contact 162, which resides in Schottky contact with or in the Schottky layer 160. As such, there is no oxide or like dielectric to insulate the gate contact 162 from the Schottky layer 160.

As above, the channel layer 156 is undoped and is formed from either Indium Gallium Arsenide (InGaAs) or GaAs in group III-V material systems. The bottom and top spacer layers 154, 158 along with the donor layer 152 are generally optional. The Schottky layer 160 and the donor layer 152, if present, are generally uniformly doped or include planar doping where a very thin layer of doping is provided near the interfaces with the channel layer 156. As illustrated, the Schottky layer 160 is formed from an unoxidized section of the oxidizable material layer 102. As such, the Schottky layer 160 is formed from the same oxidizable material layer 102 that is used to form the gate oxide 100 of the e-mode MOSFET 82. The portion of the oxidizable material layer 102 that provides the gate oxide 100 may be selectively oxidized.

In this embodiment, the e-mode MOSFET 82 is formed on the same, or substantially the same, basic epitaxial structure on which the d-mode HEMT 146 was formed. As such, the same epitaxial layers that were used to form the top spacer layer 158, channel layer 156, bottom spacer layer 154, donor layer 152, and the buffer layer 150 extend beneath the e-mode MOSFET 82. In particular, epitaxial layer 158' corresponds to the epitaxial layer from which the top spacer layer 158 was formed, epitaxial layer 156' corresponds to the epitaxial layer from which the channel layer 156 was formed, epitaxial layer 154' corresponds to the epitaxial layer from which the bottom spacer layer 154 was formed, epitaxial layer 152' corresponds to the epitaxial layer from which the donor layer 152 was formed, and epitaxial layer 150' corresponds to the epitaxial layer from which the buffer layer 150 was formed.

The oxidizable material layer 102, including the gate oxide 100, resides on or over the epitaxial layer 158'. The cap 108 below the source contact 110 may reside on the unoxidized section 104 of the oxidizable material layer 102 while the cap 112 below the drain contact 114 may reside on the unoxidized section 106 of the oxidizable material layer 102. The gate contact 98 resides on the gate oxide 100, which is formed from an oxidized portion of the oxidizable material layer 102. Source and drain regions may be doped as desired throughout the epitaxial structure (and the unoxidized sections 104 and 106) as desired to ensure the e-mode MOSFET 82 operates as an e-mode device and in a substantially complementary fashion with respect to the d-mode HEMT 148.

As illustrated in FIG. 10C, the source and drain structures 26, 28 of the embodiment of FIG. 10B may be modified such that the source and drain contacts 110, 114 reside directly on the respective unoxidized sections 104, 106. In essence, the caps 108 and 112 are removed. Also illustrated for the e-mode MOSFET 82 are the corresponding source and drain regions 92, 98, which are heavily doped (N+) with N-type doping material and extend through the various layers of the epitaxial structure. Similar doping may be provided for the d-mode HEMT 148 to provide source and drain regions 118 and 122, which are heavily doped with N-type material. Again, the structure and doping may be modified to generate complementary devices.

As illustrated in FIG. 10D, the unoxidized sections 104, 106 of the embodiment in FIG. 10C may be removed to allow the source and drain structures 26, 28 to reside directly on the epitaxial layer 158'. If the caps 108 and 112 are not provided, the source and drain contacts 110, 114 may reside directly on the epitaxial layer 158', as depicted. Such configurations may be provided on the different embodiments disclosed herein.

In an alternative embodiment, all or most of those portions of the oxidizable material layer 102 that are not used to form gate oxide 100 for the e-mode MOSFET 82 and the Schottky layer 160 of the d-mode HEMT 148 are etched away. As illustrated in FIG. 11, which generally corresponds to the embodiment of FIG. 10A, the unoxidized (or oxidized) sections 104 and 106 of the e-mode MOSFET 82 are etched away prior to forming the source and drain structures 26, 28 for both the e-mode MOSFET 82 and the d-mode HEMT 148. Accordingly, the caps 108 and 112 reside substantially directly on the body of the e-mode MOSFET 82. While the gate oxide 100 is formed from the oxidizable material layer 102, no substantial part of the oxidizable material layer 102 resides between the caps 108 and 112 after the device is formed.

In FIG. 12 another variation is illustrated for the source and drain structures 26, 28 of the e-mode MOSFET 82 and the d-mode HEMT 148. For the e-mode MOSFET 82, the source structure 26 includes a source contact 174 that is buried, or implanted, into the source region 92 of the MOSFET body. The drain structure 28 includes a drain contact 176 that is buried, or implanted, into the drain region 96 of the MOSFET body. Again, all or most of those portions of the oxidizable material layer 102 that are not used to form gate oxide 100 for the e-mode MOSFET 82 and the Schottky layer 160 of the d-mode HEMT 148 are etched away. For the d-mode HEMT 148, the source structure 26 includes a source contact 178 that is buried, or implanted, into the underlying HEMT body. The drain structure 28 includes a drain contact 180 that is buried, or implanted, into the underlying HEMT body.

With reference to FIG. 13, another embodiment of the present invention is illustrated. In particular, the e-mode MOSFET 82 and a d-mode MESFET 182 are formed on the same group III-V, semi-insulating substrate 86. The e-mode MOSFET 82 is substantially separated from the d-mode MESFET 84 by the field isolation region 88. For the e-mode MOSFET 82, the substrate 86 includes a bulk region 90, the source region 92, the channel region 94, and the drain region 96. In one embodiment, the bulk region 90 is heavily doped with P-type material, the source and drain regions 92, 96 are heavily doped with N-type material, and the channel region 94 may be lightly doped with N-type material. Notably, the bulk region 90 may remain undoped and still provide strong performance.

The amount of doping in the channel region 94 is preferably controlled to ensure the e-mode MOSFET 82 operates as an e-mode device and in a substantially complementary fashion with respect to the d-mode MOSFET 84. The gate structure 20 for the e-mode MOSFET 82 includes the gate contact 98 and the gate oxide 100

Again, the gate oxide 100 is formed from an oxidized portion of the oxidizable material layer 102. In this embodiment, both the source and drain structures 26, 28 reside over unoxidized sections 104, 106 of the oxidizable material layer 102. Portions of the unoxidized sections 104, 106 may be heavily doped with N-type material along with the source and drain regions 92, 96. The source structure 26 includes a cap 108 that resides over the unoxidized section 104 of oxidizable material layer 102 for the source region 92. A source contact 110 resides over the cap 108, which is heavily doped with N-type material. The drain structure 28 includes a cap 112 that resides over the unoxidized section 106 of the oxidizable material layer 102 for the drain region 96. A drain contact 114 resides over the cap 112, which is heavily doped with N-type material. For the d-mode MESFET 182, the substrate 86 includes a bulk region 186, a source region 188, a channel region 190, and a drain region 192. In one embodiment, the bulk region 186 is heavily doped with P-type material, while the source and drain regions 188, 192 are heavily doped with N-type material. The channel region 190 may be lightly doped with N-type material and extends between the source and drain regions 188, 192. Notably, the bulk region 186 may remain undoped and still provide strong performance.

The amount of doping in the channel region 190 is preferably controlled to ensure the d-mode MESFET 182 operates as a d-mode device and in a substantially complementary fashion with respect to the e-mode MOSFET 82. The gate structure 20 for the d-mode MESFET 182 will include a gate contact 194, but will not include a gate oxide that acts as a dielectric to isolate the body of the d-mode MESFET 84 from the gate contact 194. The gate contact resides substantially directly on the body of the d-mode MESFET 182. Notably, the gate contact 194 is not formed from the oxidizable material layer 102, but is formed in a recess that has been etched into the oxidizable material layer 102.

The illustrated source structure 26 includes a cap 196 that resides over an unoxidized section 198 of oxidizable material layer 102 over the source region 118. A source contact 200 resides over the cap 196. The cap 196 is heavily doped with N-type material to facilitate a low impedance connection between the source contact 200 and the source region 188. Similarly, the illustrated drain structure 28 includes a cap 202 that resides over an unoxidized section 204 of the oxidizable material layer 102 over the drain region 192. A drain contact 206 resides over the cap 202. The cap 202 is heavily doped with N-type material to facilitate a low impedance connection between the drain contact 206 and the drain region 192.

Reference is now made to FIG. 14. In an alternative embodiment for providing an e-mode MOSFET 82 with a d-mode MESFET 182, an unoxidized section 208 of the oxidizable material layer 102 resides under the source, gate, and drain structures 26, 20, and 28 of the d-mode MESFET 182. The unoxidized section 208 may be continuous and effectively forms an upper layer of the MESFET body. Portions of the unoxidized section 208 that reside over the source and drain regions 188, 192 are preferably heavily doped with N-type material and effectively become part of the source and drain regions 188, 192. Similarly, the portion of the unoxidized section 208 that resides over the channel region 190 is preferably lightly doped with N-type material and effectively becomes part of the channel region 190. As such, little or no etching of the oxidizable material layer 102 is necessary to form either of the e-mode MOSFET 82 or the d-mode MESFET 182.

In an alternative embodiment, all or most of those portions of the oxidizable material layer 102 that are not used to form the gate oxide 100 for the e-mode MOSFET 82 are etched away. As illustrated in FIG. 15A, the unoxidized sections 104, 106, 198, and 204 (as depicted in FIG. 14) of the e-mode MOSFET 82 and the d-mode MESFET 182, respectively, are etched away prior to forming the source and drain structures 26, 28 for the respective devices. Accordingly, caps 108, 112, 196, and 202 reside substantially directly on the bodies of the e-mode MOSFET 82 and the d-mode MESFET 182. No part of the oxidizable material layer 102 resides between the caps 108, 112, 196, and 202 and the bodies of the e-mode MOSFET 82 and the d-mode MESFET 182. As illustrated in FIG. 15B, the caps 108, 112, 128, and 130 may be removed to allow the source contacts 108, 132 and drain contacts 112, 136 to reside on the bulk region 90.

Another variation on the source and drain structures 26, 28 is provided in FIG. 16. In this example, assume those portions of the oxidizable material layer 102 that are not used to form the gate oxide 100 for the e-mode MOSFET 82 have been etched away as described in association with FIG. 15A. As such, the source structure 26 for the e-mode MOSFET 82 includes a source contact 210 that is buried, or implanted, into the source region 92. The drain structure 28 for the e-mode MOSFET 82 includes a drain contact 212 that is buried, or implanted, into the drain region 96. Similarly, the source structure 26 for the d-mode MESFET 182 includes a source contact 214 that is buried, or implanted, into the source region 188. The drain structure 28 for the d-mode MESFET 182 includes a drain contact 216 that is buried, or implanted, into the drain region 192.

In any of the above embodiments, a sub-gate area resides in the FET body and beneath the gate structure 20 of the MOSFET, HEMT, MESFET, or other FET structure. The channel regions for MOSFETs and MESFETs generally correspond to the sub-gate areas. The Schottky and donor layers, as well as any other doped layers beneath the gate structure of HEMTs generally correspond to the sub-gate areas. The sub-gate areas for an e-mode MOSFET and the complementary d-mode FET may be doped with an N-type material. Preferably, the sub-gate area for the d-mode FET is doped at higher concentration than the sub-gate region for the complementary e-mode MOSFET. The amount of doping in each sub-gate region may vary depending on the desired characteristics, such as threshold voltage, of the respective devices. However, the sub-gate region for the e-mode MOSFET may be doped at a level sufficient to ensure it operates as an e-mode device while the sub-gate region for the d-mode FET remains doped at a level sufficient to ensure it operates as a d-mode device, and preferably as a d-mode device that is substantially complementary to the e-mode MOSFET. Other factors, such as the type and thickness of the materials used to form the gate contacts may impact the operation, and in particular, the threshold voltages for the respective devices. Further, the relative thicknesses of the gate oxides and Schottky layers, which are formed from the oxidizable material layer 102, will impact the threshold voltages for the respective devices. For example, although made of the same material layer, the gate oxide of the e-mode device may differ in thickness from the Schottky layer (or gate oxide) of the d-mode device. Similarly, the gate contacts for the e-mode and d-mode devices may differ in thickness, material, or both to achieve desired parameters. These parameters should be chosen individually or as a collective to ensure that the e-mode MOSFET operates as an e-mode device and the d-mode FET operates as a d-mode device. Those skilled in the art should appreciate, after reading the preceding description, that the thicknesses, materials, and doping levels may be varied to achieve desired performance characteristics without departing from the concepts described herein.

For e-mode or d-mode MOSFETs 82, 84, such as those illustrated in FIG. 7, the oxidizable material layer 102 may be selectively oxidized in only those portions where an oxide is desired. For example, those portions of the oxidizable material layer 102 that are beneath source and drain structures 26, 28 are not oxidized while the portions of the oxidizable material layer 102 that forms the gate oxides 100, 126 are oxidized. Alternatively, all or most of the oxidizable material layer 102 may be oxidized in blanket fashion, wherein unwanted portions of the oxidized oxidizable material layer 102 are etched away after being oxidized. Desired portions, such as the gate oxides 100, 126, are maintained. As another alternative, the oxidizable material layer 102 may be selectively etched prior to being oxidized. Preferably, no oxidized portions of the oxidizable material layer 102 will reside beneath source and drain structures 26, 28 of any FET or the gate contacts of HEMT or MESFET structures.

In preferred embodiments, oxidizable material layer 102 will not include Arsenic and will be used in a GaAs-based material system. Implanted regions for source and drain implants or a gate implant are formed by selectively implanting N- or P-type dopants in FET bodies before or after at least certain portions of the oxidizable material layer 102 are oxidized. Further, it is preferable to form the FET bodies, including the body epitaxial structure for a HEMT, up to and including the oxidizable material layer 102, during a single growth sequence. A single growth sequence is one in which the body and the oxidizable material layer 102 are consecutively formed in a growth chamber without being removed from the growth chamber.

Notably, although numerous embodiments are illustrated, these embodiments are merely exemplary and provided to show some of the numerous ways in which the concepts of the present invention can be employed to combine an e-mode MOSFET and a d-mode FET, such as a MOSFET, HEMT, or MESFET, on a common substrate. Further, the above examples are focused on doping source, gate, and drain regions as well as select layers with N-type material. As an alternative, those skilled in the art will recognize that the doping materials may be reversed, wherein those materials that are doped with N-type material may be doped with P-type material, and vice versa. As such, the source, gate, and drain regions as well as select layers may be doped with P-type material, wherein the bulk regions and the like may be doped with N-type material.

Those skilled in the art will recognize improvements and modifications to the preferred embodiments of the present invention. All such improvements and modifications are considered within the scope of the concepts disclosed herein and the claims that follow.

What is claimed is:

1. An apparatus comprising:
a substrate formed from a group III-V material system;
an enhancement-mode MOSFET formed on the substrate and comprising a first body, a first source, a first drain and a first gate structure, which is provided on the first body and between the first source and the first drain, the first gate structure comprising a first gate contact and a first gate oxide, wherein the first gate oxide resides between the first gate contact and the first body and is an oxidized section of an oxidizable material that comprises Aluminum and Phosphorus; and
a depletion-mode FET formed on the substrate and comprising a second body, a second source, a second drain and a second gate structure, which is provided on the second body and between the second source and the second drain, wherein the enhancement-mode MOSFET comprises a first sub-gate area that resides within the first body and below the first gate structure and is doped with first dopant material, and the depletion-mode FET comprises a second sub-gate area that resides within the second body and below the second gate structure and is doped with the first dopant material such that the first sub-gate area is sufficiently doped to cause the enhancement-mode MOSFET to operate in an enhancement mode and the second sub-gate area is sufficiently doped to cause the depletion-mode FET to operate in a depletion mode.

2. The apparatus of claim 1 wherein an effective amount of the first doping material in the first sub-gate area is less than an effective amount of the first doping material in the second sub-gate area.

3. The apparatus of claim 1 wherein the enhancement-mode MOSFET operates in a substantially complementary fashion with respect to the depletion-mode FET.

4. The apparatus of claim 1 wherein the enhancement-mode MOSFET is normally off when no voltage is applied between the first gate structure and the first source, and the depletion-mode FET is on when no voltage is applied between the second gate structure and the second source.

5. The apparatus of claim 1 further comprising an isolation region substantially separating the first body of the enhancement-mode MOSFET from the second body of the depletion-mode FET.

6. The apparatus of claim 1 wherein the enhancement-mode MOSFET is substantially adjacent the depletion-mode FET.

7. The apparatus of claim 1 wherein the substrate comprises Gallium Arsenide.

8. The apparatus of claim 1 wherein the oxidizable material essentially does not contain Arsenic.

9. The apparatus of claim 1 wherein the second gate structure comprises a second gate contact and a second gate oxide, which resides between the second gate contact and the second body and comprises an oxidized portion of the oxidizable material such that the depletion-mode FET is a depletion-mode MOSFET, and the first gate oxide and the second gate oxide are formed from the same oxidizable material.

10. The apparatus of claim 9 wherein the first gate oxide and the second gate oxide are formed from a common layer of the oxidizable material, the first gate oxide and the second gate oxide being separate oxidized sections of the common layer.

11. The apparatus of claim 10 wherein:
the first source comprises a first source structure that resides on a first unoxidized section of the common layer of the oxidizable material and the first drain comprise a first drain structure that resides on a second unoxidized section of the common layer of the oxidizable material; and
the second source comprises a second source structure that resides on a third unoxidized section of the common layer of the oxidizable material and the second drain comprises a second drain structure that resides on a fourth unoxidized section of the common layer of the oxidizable material.

12. The apparatus of claim 10 wherein:
the first source comprises a first source structure that resides on or in the first body and without any portion of the common layer of the oxidizable material being between the first source structure and the first body;
the first drain comprises a first drain structure that resides on or in the first body and without any portion of the common layer of the oxidizable material being between the first drain structure and the first body;
the second source comprises a second source structure that resides on or in the second body and without any portion of the common layer of the oxidizable material being between the second source structure and the second body; and
the second drain comprises a second drain structure that resides on or in the second body and without any portion of the common layer of the oxidizable material being between the second drain structure and the second body.

13. The apparatus of claim 10 wherein the first gate oxide and the second gate oxide have different thicknesses.

14. The apparatus of claim 1 wherein the depletion-mode FET is a depletion mode HEMT, and the second body comprises an epitaxial structure comprising a buffer layer, a channel layer over the buffer layer, and a Schottky layer over the channel layer.

15. The apparatus of claim 14 wherein the Schottky layer is formed from an unoxidized section of the oxidizable material.

16. The apparatus of claim 15 wherein the first gate oxide and the Schottky layer are formed from a common layer of the oxidizable material, the first gate oxide being an oxidized section of the common layer and the Schottky layer being an unoxidized section of the common layer.

17. The apparatus of claim 15 wherein the second gate structure comprises a gate contact provided in Schottky contact with the Schottky layer.

18. The apparatus of claim 15 wherein the second source comprises a source structure residing on or in the Schottky layer and the second drain comprises a drain structure residing on or in the Schottky layer.

19. The apparatus of claim 15 wherein:
the first source comprises a first source structure that resides on a first unoxidized section of the common layer of the oxidizable material and the first drain comprise a first drain structure that resides on a second unoxidized section of the common layer of the oxidizable material; and
the second source comprises a second source structure that resides on a third unoxidized section of the common layer of the oxidizable material and the second drain comprise a second drain structure that resides on a fourth unoxidized section of the common layer of the oxidizable material.

20. The apparatus of claim 15 wherein:
the first source comprises a first source structure that resides on or in the first body and without any portion of the common layer of the oxidizable material being between the first source structure and the first body; and the first drain comprises a first drain structure that resides on or in the first body and without any portion of the common layer of the oxidizable material being between the first drain structure and the first body.

21. The apparatus of claim 15 wherein the first gate oxide and the Schottky layer have different thicknesses.

22. The apparatus of claim 1 wherein the second gate structure comprises a second gate contact, the first gate contact having a thickness different from that of the second gate contact.

23. The apparatus of claim 1 wherein the second gate structure comprises a second gate contact, the first gate contact formed from a material that is different from that of the second gate contact.

24. The apparatus of claim 1 wherein the second gate structure comprises a second gate that resides in Schottky contact with the second body.

25. The apparatus of claim 24 wherein the first source comprises a first source structure that resides on a first unoxidized section of a common layer of the oxidizable material from with the first gate oxide was formed, and the first drain comprise a first drain structure that resides on a second unoxidized section of the common layer of the oxidizable material.

26. The apparatus of claim 25 wherein the second source comprises a second source structure that resides on a third unoxidized section of the common layer of the oxidizable material and the second drain comprise a second drain structure that resides on a fourth unoxidized section of the common layer of the oxidizable material.

27. The apparatus of claim 24 wherein:
the first source comprises a first source structure that resides on or in the first body and without any portion of a common layer of the oxidizable material from which the first gate oxide was formed being between the first source structure and the first body;
the first drain comprises a first drain structure that resides on or in the first body and without any portion of the common layer of the oxidizable material being between the first drain structure and the first body;
the second source comprises a second source structure that resides on or in the second body and without any portion of the common layer of the oxidizable material being between the first source structure and the second body; and
the second drain comprises a second drain structure that resides on or in the second body and without any portion of the common layer of the oxidizable material being between the second drain structure and the second body.

28. The apparatus of claim 1 wherein the first body and the first gate oxide of the enhancement-mode MOSFET and the second body of the depletion-mode FET are formed from a single growth sequence.

29. The apparatus of claim 1 wherein:
the first source comprises a source region in the first body and the first drain comprises a drain region in the first body;
the source region and the drain region are heavily doped with N-type material;
a channel region extends between the source region and the drain region and is lightly doped with the N-type material; and
a bulk region in the first body and below the channel region is doped with P-type material.

30. The apparatus of claim 1 wherein the oxidizable material is essentially Aluminum Phosphide.

31. The apparatus of claim 1 wherein the oxidizable material is essentially Indium Aluminum Phosphide.

32. The apparatus of claim 1 wherein the oxidizable material is essentially Indium Aluminum Gallium Phosphide.

33. An apparatus comprising:
a substrate formed from a group III-V material system;
an enhancement-mode MOSFET formed on the substrate and comprising a first body, a first source, a first drain and a first gate structure, which is provided on the first body and between the first source and the first drain, the first gate structure comprising a first gate contact and a first gate oxide, wherein the first gate oxide resides between the first gate contact and the first body and is an oxidized section of an oxidizable material that comprises Aluminum and Phosphorus; and
a depletion-mode FET formed on the substrate and comprising a second body, a second source, a second drain and a second gate structure, which is provided on the second body and between the second source and the second drain, wherein the second gate structure comprises a second gate that resides in Schottky contact with the second body, and wherein the first source comprises a first source structure that resides on a first unoxidized section of a common layer of the oxidizable material from with the first gate oxide was formed, and the first drain comprise a first drain structure that resides on a second unoxidized section of the common layer of the oxidizable material.

34. The apparatus of claim 33 wherein the second source comprises a second source structure that resides on a third unoxidized section of the common layer of the oxidizable material and the second drain comprise a second drain structure that resides on a fourth unoxidized section of the common layer of the oxidizable material.

35. An apparatus comprising:
a substrate formed from a group III-V material system;
an enhancement-mode MOSFET formed on the substrate and comprising a first body, a first source, a first drain and a first gate structure, which is provided on the first body and between the first source and the first drain, the first gate structure comprising a first gate contact and a first gate oxide, which resides between the first gate contact and the first body and is an oxidized section of an oxidizable material that comprises Aluminum and Phosphorus; and a depletion-mode FET formed on the substrate and comprising a second body, a second source, a second drain and a second gate structure, which is provided on the second body and between the second source and the second drain, wherein the second gate structure comprises a second gate that resides in Schottky contact with the second body, and wherein:
the first source comprises a first source structure that resides on or in the first body and without any portion of a common layer of the oxidizable material from which the first gate oxide was formed being between the first source structure and the first body;
the first drain comprises a first drain structure that resides on or in the first body and without any portion of the common layer of the oxidizable material being between the first drain structure and the first body;
the second source comprises a second source structure that resides on or in the second body and without any portion of the common layer of the oxidizable material being between the first source structure and the second body; and
the second drain comprises a second drain structure that resides on or in the second body and without any portion of the common layer of the oxidizable material being between the second drain structure and the second body.

* * * * *